(12) United States Patent
Joei et al.

(10) Patent No.: US 11,049,906 B2
(45) Date of Patent: *Jun. 29, 2021

(54) IMAGING DEVICE, MANUFACTURING DEVICE, AND MANUFACTURING METHOD

(71) Applicant: SONY SEMICONDUCTOR SOLUTIONS CORPORATION, Kanagawa (JP)

(72) Inventors: Masahiro Joei, Kanagawa (JP); Shuji Manda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/778,053

(22) Filed: Jan. 31, 2020

(65) Prior Publication Data

US 2020/0168665 A1 May 28, 2020

Related U.S. Application Data

(63) Continuation of application No. 16/126,756, filed on Sep. 10, 2018, now Pat. No. 10,580,831, which is a
(Continued)

(30) Foreign Application Priority Data

Oct. 6, 2014 (JP) .................................. 2014-205442

(51) Int. Cl.
*H01L 27/30* (2006.01)
*H01L 27/146* (2006.01)
(Continued)

(52) U.S. Cl.
CPC .......... *H01L 27/307* (2013.01); *H01L 27/146* (2013.01); *H01L 27/14623* (2013.01);
(Continued)

(58) Field of Classification Search
CPC ................. H01L 27/307; H01L 27/146; H01L 27/14623; H01L 27/14645; H01L 31/10; H01L 51/44; H01L 51/448; Y02E 10/549
(Continued)

(56) References Cited

U.S. PATENT DOCUMENTS

| 10,580,831 | B2 * | 3/2020 | Joei ....................... H01L 51/448 |
| 2007/0120045 | A1 | 5/2007 | Yokoyama |

(Continued)

FOREIGN PATENT DOCUMENTS

| JP | 2007-067194 A | 3/2007 |
| JP | 2008-004899 A | 1/2008 |

(Continued)

OTHER PUBLICATIONS

Non-Final Office Action for U.S. Appl. No. 16126756, dated Jun. 27, 2019, 06 pages.
(Continued)

*Primary Examiner* — Tu-Tu V Ho
(74) *Attorney, Agent, or Firm* — Chip Law Group

(57) ABSTRACT

The present technology relates to an imaging device, a manufacturing device, and a manufacturing method. The imaging device includes an organic photoelectric conversion film, an upper electrode provided in an upper portion of the organic photoelectric conversion film, a lower electrode provided in a lower portion of the organic photoelectric conversion film, and a metal thin film provided between the organic photoelectric conversion film and the upper electrode or between the organic photoelectric conversion film and the lower electrode. The metal thin film is provided between the organic photoelectric conversion film and the upper electrode. The upper electrode is formed of an oxide semiconductor, a metal oxide, and the metal thin film. The present technology can be applied to a vertical spectral imaging device.

17 Claims, 22 Drawing Sheets

Related U.S. Application Data continuation of application No. 15/512,550, filed as application No. PCT/JP2015/077011 on Sep. 25, 2015, now Pat. No. 10,074,696.

(51) Int. Cl.
*H01L 31/10* (2006.01)
*H01L 51/44* (2006.01)

(52) U.S. Cl.
CPC ........ *H01L 27/14645* (2013.01); *H01L 31/10* (2013.01); *H01L 51/44* (2013.01); *H01L 51/448* (2013.01); *Y02E 10/549* (2013.01)

(58) Field of Classification Search
USPC .......................................................... 257/43
See application file for complete search history.

(56) References Cited

U.S. PATENT DOCUMENTS

| | | |
|---|---|---|
| 2014/0070183 A1 | 3/2014 | Park et al. |
| 2014/0239271 A1 | 8/2014 | Leem et al. |
| 2015/0096610 A1 | 4/2015 | Okubo et al. |
| 2015/0188065 A1 | 7/2015 | Takimoto |

FOREIGN PATENT DOCUMENTS

| | | |
|---|---|---|
| JP | 2009-267169 A | 11/2009 |
| KR | 10-2014-0036071 A | 3/2014 |
| WO | 2014/021177 A1 | 2/2014 |

OTHER PUBLICATIONS

Notice of Allowance for U.S. Appl. No. 16126756, dated Oct. 31, 2019, 05 pages.
International Search Report and Written Opinion of PCT Application No. PCT/JP2015/077011, dated Nov. 24, 2015,13 pages of English Translation and 09 pages of ISRWO.
International Preliminary Report on Patentability of PCT Application No. PCT/JP2015/077011, dated Apr. 20, 2017, 13 pages of English Translation and 06 pages of IPRP.
Non-Final Office Action for U.S. Appl. No. 15512550, dated Sep. 7, 2017, 11 pages.
Final Office Action for U.S. Appl. No. 15512550, dated Feb. 12, 2018, 13 pages.
Notice of Allowance for U.S. Appl. No. 15512550, dated May 18, 2018, 05 pages.
Office Action for CN Patent Application No. 201580052657 dated Oct. 19, 2020.

\* cited by examiner

FIG. 21

| TRANSPARENT ELECTRODE | COMPOSITION | COMPOSITION OF ENTHALPY CONTROL LAYER | TRANSPARENT ELECTRODE | COMPOSITION | COMPOSITION OF ENTHALPY CONTROL LAYER |
|---|---|---|---|---|---|
| ITO | SnO(c)-280.71<br>SnO2(c)-577.63<br>TiO(c)-542.66<br>TiO2(c)-939.7<br>TiO2(c2)-944.7<br>Ti2O3(c)-1520.9<br>Ti3O5(c)-2459.4<br>Ti4O7(c)-3404.52<br>In2O3(c)-925.79 | Ag2O-31.05<br>CoO-237.94<br>CdO-258.2<br>CuO-157.3<br>Cu2O-168.6<br>GeO(c)-261.9<br>NiO(c)-239.7<br>PbO(c)-218.99<br>PbO2(c2)-217.32<br>PbO2(c)-277.4<br>PdO(c)-85.4<br>SeO2(c)-225.35<br>SeO3(c)-166.9<br>Tl2O(c)-178.7 | IZO | ZnO(c)-348.284<br>In2O3(c)-925.79 | Ag2O-31.05<br>CoO-237.94<br>CdO-258.2<br>Cs2O-345.98<br>CuO-157.3<br>Cu2O-168.6<br>GeO(c)-261.9<br>NiO(c)-239.7<br>PbO(c)-218.99<br>PbO2(c2)-217.32<br>PbO2(c)-277.4<br>PdO(c)-85.4<br>Rb2O(c)-339<br>SeO2(c)-225.35<br>SeO3(c)-166.9<br>SnO(c)-280.71<br>TeO2(C)-321<br>Tl2O(c)-178.7 |
| IGZO | ZnO(c)-348.28<br>In2O3(c)-925.79<br>Ga2O3(c)-1089.1 | Ag2O-31.05<br>CoO-237.94<br>CdO-258.2<br>Cs2O-345.98<br>CuO-157.3<br>Cu2O-168.6<br>GeO(c)-261.9<br>NiO(c)-239.7<br>PbO(c)-218.99<br>PbO2(c2)-217.32<br>PbO2(c)-277.4<br>PdO(c)-85.4<br>Rb2O(c)-339<br>SeO2(c)-225.35<br>SeO3(c)-166.9<br>SnO(c)-280.71<br>TeO2(C)-321<br>Tl2O(c)-178.7 | ZnO | ZnO(c)-348.28 | Ag2O-31.05<br>CoO-237.94<br>CdO-258.2<br>Cs2O-345.98<br>CuO-157.3<br>Cu2O-168.6<br>GeO(c)-261.9<br>NiO(c)-239.7<br>PbO(c)-218.99<br>PbO2(c2)-217.32<br>PbO2(c)-277.4<br>PdO(c)-85.4<br>Rb2O(c)-339<br>SeO2(c)-225.35<br>SeO3(c)-166.9<br>SnO(c)-280.71<br>TeO2(C)-321<br>Tl2O(c)-178.7 |

IMAGING DEVICE, MANUFACTURING DEVICE, AND MANUFACTURING METHOD

CROSS REFERENCE TO RELATED APPLICATIONS

This application is a continuation of U.S. patent application Ser. No. 16/126,756 filed on Sep. 10, 2018, which is a continuation of U.S. patent application Ser. No. 15/512,550, filed Mar. 18, 2017, now U.S. Pat. No. 10,074,696, which is a National Stage Entry of Patent Application No. PCT/JP2015/077011 filed Sep. 25, 2015, which claims priority benefit of Japanese Patent Application No. JP 2014-205442 filed in the Japan Patent Office Oct. 6, 2014. Each of the above-referenced applications is hereby incorporated herein by reference in its entirely.

TECHNICAL FIELD

The present technology relates to an imaging device, a manufacturing device, and a manufacturing method. Specifically, the present technology relates to an imaging device, a manufacturing device, and a manufacturing method preferably used to reduce an influence of hydrogen.

BACKGROUND ART

In recent years, in a charge coupled device (CCD) image sensor or a complementary metal oxide semiconductor (CMOS), a pixel size has been reduced. Therefore, sensitivity is lowered due to reduction in the number of photons incident on a unit pixel, and an S/N ratio is lowered. In addition, in a presently widely-used pixel array in which pixels of red, green, and blue are arranged on a plane, for example, in a Bayer array using a primary color filter, for example, in a red pixel, green and blue light does not pass through the color filter and is not used for photoelectric conversion, and therefore sensitivity is lost. In addition, when an interpolation process is performed between pixels, a false color may be generated due to generation of a color signal.

An image sensor to obtain three color photoelectric conversion signals with one pixel by stacking three photoelectric conversion layers in a vertical direction has been proposed. In Patent Document 1, as such a structure for stacking three color photoelectric conversion layers with one pixel, for example, a sensor in which a photoelectric conversion unit for detecting green light and generating a signal charge corresponding thereto is provided above a silicon substrate and blue light and red light are detected by two photodiodes stacked in the silicon substrate has been proposed.

In addition, Patent Document 2 has proposed a back surface irradiation type structure provided with a photoelectric conversion film 1 layer above a silicon substrate, having a two color photoelectric conversion unit in the silicon substrate, and having a circuit-forming surface formed on a side opposite to a light-receiving surface. When a back surface irradiation type organic photoelectric conversion layer is formed, a circuit, wiring, or the like is not formed between an inorganic photoelectric conversion unit and an organic photoelectric conversion unit. Therefore, a distance between the inorganic photoelectric conversion unit and the organic photoelectric conversion unit in the same pixel can be close to each other. Therefore, dependence of colors on an F value can be suppressed, and fluctuation in sensitivity between the colors can be suppressed.

CITATION LIST

Patent Document

Patent Document 1: Japanese Patent Application Laid-Open No. 2003-332551
Patent Document 2: Japanese Patent Application Laid-Open No. 2011-29337
Patent Document 3 Japanese Patent Application Laid-open No. 2008-252004

SUMMARY OF THE INVENTION

Problems to be Solved by the Invention

An organic photoelectric conversion film is generally susceptible to water or oxygen, and therefore it is necessary to form a sealing structure in an upper layer of an organic photoelectric conversion film. For example, Patent Document 3 has proposed formation of a sealing structure formed by stacking a SiN film formed by a sputtering method and an AlO film formed by an ALD method.

However, when such a sealing film is formed, the ALD method needs to use an organic metal such as trimethylaluminum (TMA) as a precursor, and hydrogen in the precursor may be diffused to upper and lower transparent electrodes. As a result of diffusion, not only the upper electrode but also the lower electrode is reduced, a work function becomes shallow, and an organic photoelectric conversion efficiency may be deteriorated.

The lower electrode preferably has a deep work function, and the upper electrode preferably has a shallow work function. This is because this can reduce a dark current by making an electron injection barrier from the lower electrode higher, and can improve a carrier extraction efficiency by increasing an internal electric field.

Therefore, as described above, it is desired to prevent diffusion of hydrogen in the precursor to the lower transparent electrode, reduction of the lower electrode, shallowing of the work function, and deterioration of an organic photoelectric conversion efficiency.

The present technology has been achieved in view of such a situation, and makes it possible to prevent conversion of the work function due to diffusion of hydrogen and deterioration in the organic photoelectric conversion efficiency.

Solutions to Problems

An imaging device in an aspect of the present technology includes an organic photoelectric conversion film, an upper electrode provided in an upper portion of the organic photoelectric conversion film, a lower electrode provided in a lower portion of the organic photoelectric conversion film, and a metal thin film provided between the organic photoelectric conversion film and the upper electrode or between the organic photoelectric conversion film and the lower electrode.

The metal thin film is provided between the organic photoelectric conversion film and the upper electrode. The upper electrode can be formed of an oxide semiconductor, a metal oxide, and the metal thin film.

The metal oxide is aluminum oxide (AlO). The metal thin film can be formed of aluminum (Al).

The metal thin film can be formed of any one of aluminum (Al), indium (In), silver (Ag), gold (Au), zinc (Zn), lithium (Li), tin (Sn), antimony (Sb), magnesium (Mg), cadmium (Cd), calcium (Ca), potassium (K), rubidium (Rb), cesium (Cs), strontium (Sr), barium (Ba), cerium (Ce), yttrium (Y), hafnium (Hf), nickel (Ni), gallium (Ga), and titanium (Ti).

Each of the upper electrode and the lower electrode can be formed of any one of ITO, tin oxide-based SnO2, zinc oxide-based materials aluminum zinc oxide, gallium zinc oxide, and indium zinc oxide, IGZO, CuI, InSbO4, ZnMgO, CuInO2, MgIn2O4, CdO, and ZnSnO3.

The organic photoelectric conversion film can be formed of any one of a quinacridone derivative, a naphthalene derivative, an anthracene derivative, a phenanthrene derivative, a tetracene derivative, a pyrene derivative, a perylene derivative, and a fluoranthene derivative.

The organic photoelectric conversion film can be formed of any one of a polymer of phenylene vinylene, fluorene, carbazole, indole, pyrene, pyrrole, picoline, thiophene, acetylene, or diacetylene, and a derivative thereof, a metal complex dye, a cyanine dye, a merocyanine dye, a phenylxanthene dye, a triphenylmethane dye, a rhodacyanine dye, a xanthene dye, a macrocyclic azaannulene dye, an azulene dye, naphthoquinone, an anthraquinone dye, a condensed polycyclic aromatic compound such as anthracene or pyrene, a chain compound obtained by condensing an aromatic ring or heterocyclic compound, a heterocyclic ring compound containing two nitrogen atoms and having a squarylium group and a croconic methine group as a bonding chain, such as quinoline, benzothiazole, or benzoxazole, and a cyanine-like dye bonded by a squarylium group and a croconic methine group. The metal complex dye can be any one of a dithiol metal complex dye, a metal phthalocyanine dye, a metal porphyrin dye, and a ruthenium complex dye.

The metal thin film can have a thickness of 5 nm or less.

The metal thin film has a spherical shape or a predetermined shape, and can be scattered at equal intervals or at random.

A hole blocking layer can be provided between the metal thin film and the organic photoelectric conversion film.

An enthalpy control layer can be provided along with the metal thin film or in place of the metal thin film.

The enthalpy control layer can be provided between the organic photoelectric conversion film and the lower electrode.

The enthalpy control layer can be formed of any one of Ag2O, CoO, Co3O4, CdO, Cs2O, CuO, Cu2O, GeO(c), GeO2(c1), GeO2(c2), NiO(c), PbO(c), PbO2(c2), PbO2(c), PdO(c), Rb2O(c), Rb2O2(c), SeO2(c), SeO3(c), TeO2(C), Tl2O(c), and Tl2O3(c).

A manufacturing device in an aspect of the present technology forms an organic photoelectric conversion film, forms an upper electrode in an upper portion of the organic photoelectric conversion film, forms a lower electrode in a lower portion of the organic photoelectric conversion film, and forms a metal thin film between the organic photoelectric conversion film and the upper electrode or between the organic photoelectric conversion film and the lower electrode.

The metal thin film can be formed by vapor deposition.

The metal thin film can be formed between the organic photoelectric conversion film and the upper electrode. The upper electrode can be formed by stacking an oxide semiconductor, a metal oxide, and the metal thin film. The metal oxide can be formed by oxidization at the time of film formation of the oxide semiconductor.

The metal thin film can be formed into a spherical shape or a predetermined shape so as to be scattered at equal intervals or at random.

A hole blocking layer can be further formed between the metal thin film and the organic photoelectric conversion film.

An enthalpy control layer can be formed along with the metal thin film or in place of the metal thin film.

A manufacturing method in an aspect of the present technology includes steps of forming an organic photoelectric conversion film, forming an upper electrode in an upper portion of the organic photoelectric conversion film, forming a lower electrode in a lower portion of the organic photoelectric conversion film, and forming a metal thin film between the organic photoelectric conversion film and the upper electrode or between the organic photoelectric conversion film and the lower electrode.

An imaging device in an aspect of the present technology includes an organic photoelectric conversion film, an upper electrode provided in an upper portion of the organic photoelectric conversion film, a lower electrode provided in a lower portion of the organic photoelectric conversion film, and a metal thin film provided between the organic photoelectric conversion film and the upper electrode or between the organic photoelectric conversion film and the lower electrode.

A manufacturing device and a manufacturing method in an aspect of the present technology manufacture the imaging device.

Effects of the Invention

According to an aspect of the present technology, it is possible to prevent conversion of a work function due to diffusion of hydrogen and deterioration in an organic photoelectric conversion efficiency.

Note that effects of the present technology are not necessarily limited to the effects described herein, and may include any of the effects described in the present disclosure.

BRIEF DESCRIPTION OF DRAWINGS

FIG. 21 is a diagram for explaining a material forming an enthalpy control layer.

MODES FOR CARRYING OUT THE INVENTION

Figure 1:
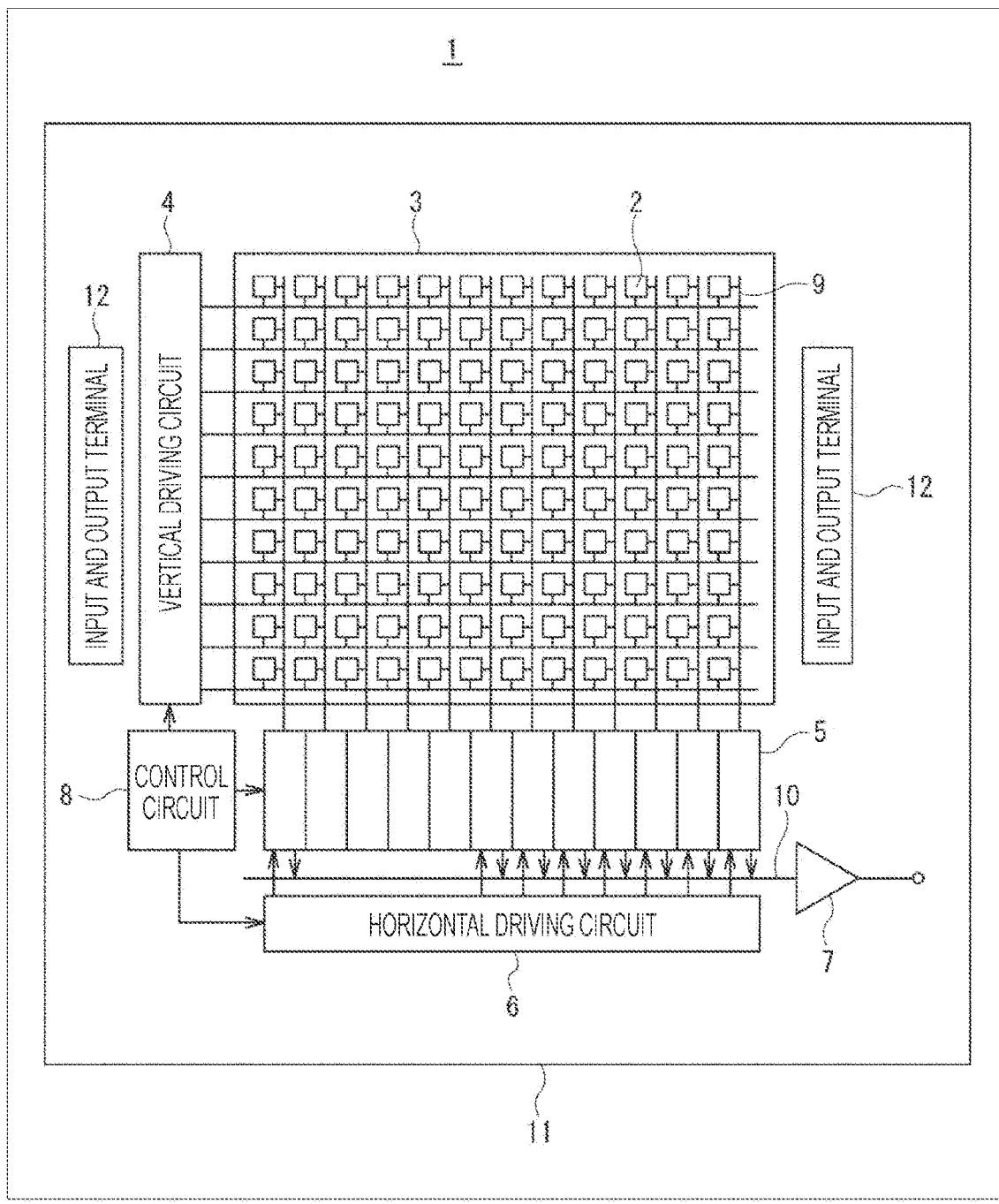
FIG. 1 is a diagram for explaining a configuration of an imaging device.

Hereinafter, modes for carrying out the present technology (hereinafter, referred to as embodiments) will be described. Note that the description will be made in the following order.
1. Configuration of imaging device
2. Configuration of conventional imaging device
3. Configuration of first imaging device
4. Manufacturing of imaging device
5. Configuration of second imaging device
6. Configuration of third imaging device
7. Configuration of fourth imaging device
8. Configuration of electronic apparatus
9. Usage example of imaging device <Configuration of Imaging Device>

FIG. 1 illustrates a schematic configuration of an example of a CMOS imaging device applied to the present embodiment. As illustrated in FIG. 1, an imaging device 1 of the present example includes a semiconductor substrate 11, a pixel unit (so-called imaging region) 3 in which a plurality of pixels 2 each including a photoelectric conversion unit is two-dimensionally arranged with regularity on a silicon substrate, for example, and a peripheral circuit unit. Each of the pixels 2 includes a photoelectric conversion unit and a plurality of pixel transistors (so-called MOS transistors).

A plurality of pixel transistors can be formed, for example, by three transistors of a transfer transistor, a reset transistor, and an amplification transistor. In addition, by adding a selection transistor, the plurality of pixel transistors can be formed by four transistors. An equivalent circuit of a unit pixel is similar to a usual circuit, and therefore detailed description thereof will be omitted. In addition, a so-called pixel shared structure in which a plurality of photoelectric conversion units shares pixel transistors other than the transfer transistor and shares floating diffusion can be applied as a pixel.

The peripheral circuit unit includes a vertical driving circuit 4, a column signal processing circuit 5, a horizontal driving circuit 6, an output circuit 7, a control circuit 8, and the like.

The control circuit 8 receives an input clock and data giving a command of an operation mode or the like, and outputs data of internal information or the like of an imaging device. That is, the control circuit 8 generates a clock signal and a control signal serving as references for operations of the vertical driving circuit 4, the column signal processing circuit 5, the horizontal driving circuit 6, and the like on the basis of a vertical synchronization signal, a horizontal synchronization signal, and a master clock. Then, these signals are input to the vertical driving circuit 4, the column signal processing circuit 5, the horizontal driving circuit 6, and the like.

The vertical driving circuit 4 is formed, for example, of a shift register, selects pixel driving wiring, supplies a pulse for driving a pixel to the selected pixel driving wiring, and drives the pixel in units of rows. That is, the vertical driving circuit 4 sequentially selects and scans each of the pixels 2 in the pixel region 3 in units of rows in a vertical direction, and supplies a pixel signal based on a signal charge generated in accordance with the amount of light received, for example, in a photodiode serving as a photoelectric conversion element of each of the pixels 2 to the column signal processing circuit 5 through a vertical signal line 9.

The column signal processing circuit 5 is disposed, for example, for each of columns of the pixels 2, and performs signal processing such as removal of a noise for a signal output from the pixels 2 in one row for each of the pixel columns. That is, the column signal processing circuit 5 performs signal processing such as CDS for removing a fixed pattern noise unique to the pixels 2, signal amplification, or AD conversion. In an output stage of the column signal processing circuit 5, a horizontal selection switch (not illustrated) is connected and provided between the column signal processing circuit 5 and a horizontal signal line 10.

The horizontal driving circuit 6 is formed of a shift register, for example. The horizontal driving circuit 6 sequentially selects each of the column signal processing circuits 5 by sequentially outputting a horizontal scan pulse, and causes each of the column signal processing circuits 5 to output a pixel signal to the horizontal signal line 10.

The output circuit 7 performs signal processing for a signal sequentially supplied from each of the column signal processing circuits 5 through the horizontal signal line 10, and outputs the processed signal. For example, only buffering is performed, or black level adjustment, column variation correction, various types of digital signal processing, and the like are performed. An input and output terminal 12 exchanges a signal with the outside.

<Configuration of Conventional Imaging Device>

Figure 2:
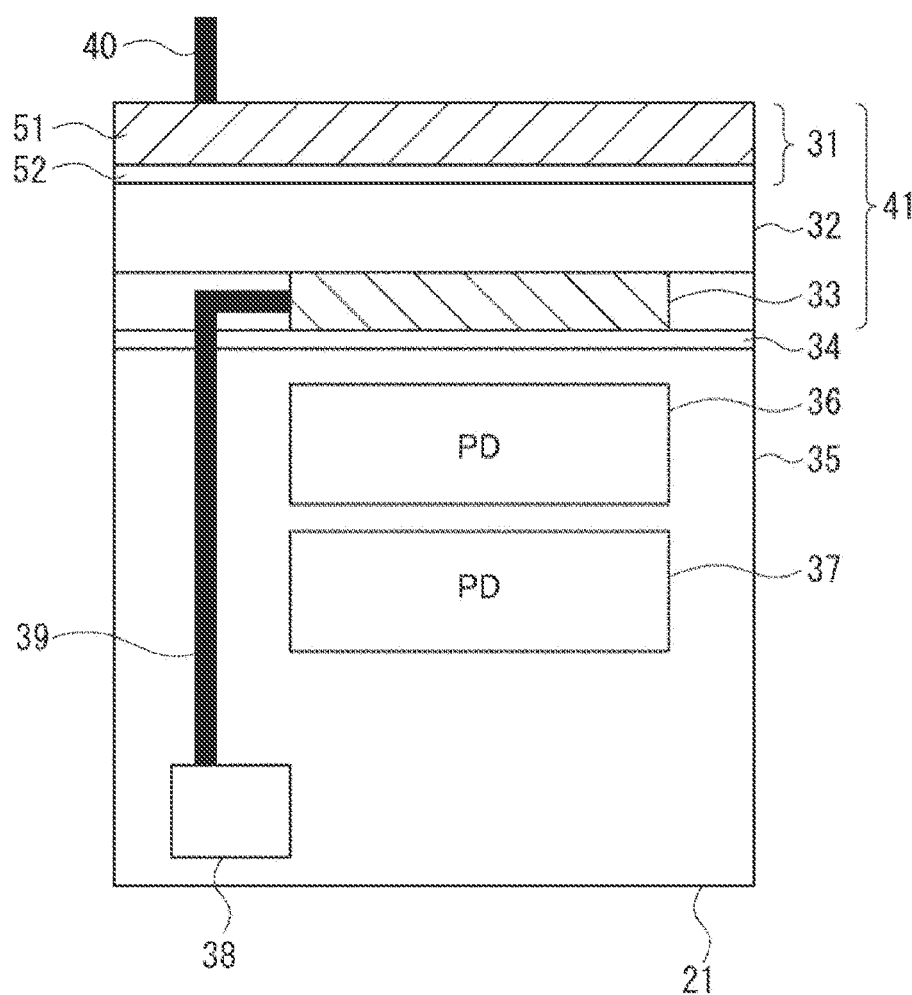
FIG. 2 is a diagram for explaining a configuration of an imaging device.

In order to clarify a difference between the imaging device to which the present technology is applied and a conventional imaging device, first, referring to FIG. 2, the conventional imaging device will be described. FIG. 2 is a diagram illustrating a configuration of a conventional imaging device. The imaging device illustrated in FIG. 2 is a CMOS imaging device. FIG. 2 is a cross-sectional view of one pixel 20 in a pixel unit of the CMOS imaging device.

An imaging device 21 is formed by stacking one organic photoelectric conversion unit 41 and inorganic photoelectric conversion units PD 36 and the PD 37 having two pn junctions in the same pixel, that is, in one pixel in a depth direction.

More specifically, the imaging device 21 includes a semiconductor substrate (silicon substrate) 35 in which an inorganic photoelectric conversion unit is formed. A light-receiving surface on which light is incident is formed on a back surface side (upper side of the substrate 35 in FIG. 2) of the substrate 35. A circuit including a read circuit or the like is formed on a surface side of the substrate 35. That is, the imaging device 21 includes the light-receiving surface on the back surface side of the substrate 35 and a circuit-forming surface formed on a substrate surface side opposite to the light-receiving surface. The semiconductor substrate 35 is formed of a first conductivity type, for example, an n-type semiconductor substrate.

In the semiconductor substrate 35, an inorganic photoelectric conversion unit having two pn junctions, that is, a first photodiode PD 36 and a second photodiode PD 37 are formed so as to be stacked in a depth direction from the back surface side. In the semiconductor substrate 35, the first photodiode PD 36 is formed, and the second photodiode PD 37 is formed from the back surface side toward a depth direction (downward direction in FIG. 2).

In this example, the first photodiode PD 36 is for blue, and the second photodiode PD 37 is for red.

On the other hand, a first color organic photoelectric conversion unit 41 in which upper and lower surfaces of an organic photoelectric conversion film 32 are sandwiched by an upper electrode 31 and a lower electrode 33 is stacked on an upper layer of a back surface of a substrate in a region in which the first photodiode PD 36 and the second photodiode PD 37 are formed. In this example, the organic photoelectric conversion unit 36 is for green. The upper electrode 31 and the lower electrode 33 are formed, for example, of a transparent conductive film such as an indium tin oxide (ITO) film or an indium zinc oxide film.

Here, description will be made by assuming that the upper electrode 31 is formed of an oxide semiconductor (ITO) 51 and an aluminum oxide (AlO) thin film 52. In addition, description will be made by assuming that the lower electrode 33 is formed of an oxide semiconductor (ITO).

Here, as a combination of colors, the organic photoelectric conversion unit 41 is green, the first photodiode PD 36 is blue, and the second photodiode PD 37 is red. However, another color combination can be used. For example, the organic photoelectric conversion unit 41 can be red or blue, and the first photodiode PD 36 and the second photodiode PD 37 can be set to other corresponding colors. In this case, positions of the first and second photodiodes PD 36 and PD 37 in the depth direction are set according to the color.

As an organic photoelectric conversion film for performing photoelectric conversion with green wavelength light, for example, an organic photoelectric conversion material containing a rhodamine dye, a meracyanine dye, or quinacridone can be used. As an organic photoelectric conversion film for performing photoelectric conversion with red wavelength light, an organic photoelectric conversion material containing a phthalocyanine dye can be used. As an organic photoelectric conversion film for performing photoelectric conversion with blue wavelength light, an organic photoelectric conversion material containing a coumarin dye, tris-8-hydryxyquinoline Al (Alq3), a meracyanine dye, or the like can be used.

In the organic photoelectric conversion unit 41, the transparent lower electrode 33 is formed, and an insulating film 34 for insulating and separating the lower electrode 33 is formed. Then, the organic photoelectric conversion film 32 is formed on the lower electrode 33, and the transparent upper electrode 31 is formed thereon.

In the semiconductor substrate 35 in one pixel 20, a pair of wiring 39 and wiring 40 is formed. The lower electrode 33 in the organic photoelectric conversion unit 41 is connected to the wiring 39, and the upper electrode 31 is connected to the wiring 40.

For example, in order to suppress short-circuiting with Si, the wiring 39 and the wiring 40 can be formed of SiO2, a tungsten (W) plug having a SiN insulating layer in the periphery thereof, or a semiconductor layer by ion implantation. In this example, a signal charge is an electron. Therefore, the wiring 39 is an n-type semiconductor layer when being formed of a semiconductor layer by ion implantation. An upper electrode extracts a hole, and therefore can use a p-type.

In this example, an n-type region 38 for charge accumulation is formed on a surface side of the substrate 35. This n-type region 38 functions as a floating diffusion portion of the organic photoelectric conversion unit 41.

As the insulating film 34 on the back surface of the semiconductor substrate 35, a film having a negative fixed charge can be used. Examples of the film having a negative fixed charge include a hafnium oxide film. That is, the insulating film 34 may be formed of a three-layer structure obtained by sequentially forming a silicon oxide film, a hafnium oxide film, and a silicon oxide film from the back surface.

On the circuit-forming surface on the surface side of the substrate 35, a plurality of pixel transistors corresponding to the organic photoelectric conversion unit 36, the first photodiode PD 36, and the second photodiode PD 37 is formed. As the plurality of pixel transistors, the above four transistor configuration or the three transistor configuration can be used. A configuration sharing a pixel transistor can be also used. In FIG. 2, these transistors are not illustrated.

Note that in the surface side of the semiconductor substrate 35, a pixel transistor of a pixel unit is formed, and a peripheral circuit such as a logic circuit is formed in the peripheral circuit unit, although not illustrated. A layer containing a peripheral circuit or the like is referred to as a multilayer wiring layer. The multilayer wiring layer is provided on the lower side of the substrate 35 in FIG. 2, although not illustrated.

A back surface side of the semiconductor substrate 35, more specifically, a surface of the upper electrode 31 of the organic photoelectric conversion unit 41 is a light-receiving surface. In addition, an on-chip lens (not illustrated) is formed on the organic photoelectric conversion unit 41 through a flattened film (not illustrated). In this example, no color filter is formed.

An operation (driving method) of the imaging device 21 will be described. The imaging device 21 is formed as a so-called back surface irradiation type imaging device irradiated with light from the substrate back surface side. In this example, a fixed negative voltage VL (<0 V) is applied to the lower electrode 33 of the organic photoelectric conversion unit 36 through necessary wiring of the multilayer wiring layer, and a voltage VU (>VL) higher than the voltage VL of the lower electrode 33, for example, a power supply voltage is applied to the upper electrode 31 at the time of charge accumulation. That is, the negative voltage VL is applied to the lower electrode 33 closer to the semiconductor substrate 35.

At the time of charge accumulation, when light is incident on one pixel 20 without passing through a color filter, green wavelength light is photoelectrically converted in the organic photoelectric conversion film 32 having an absorption characteristic in the green wavelength light. Of an electron-hole pair generated by the photoelectric conversion, an electron serving as a signal charge is attracted by the upper electrode 31 of the high potential VU.

A photoelectrically converted hole is attracted by the lower electrode 33 of VL as a negative electrode. Blue wavelength light is absorbed by the first photodiode PD 36 formed in a shallow portion close to the back surface of the semiconductor substrate 35, is photoelectrically converted, and a signal charge corresponding to blue is accumulated. The red wavelength light is absorbed by the second photodiode PD 37 formed in a deep portion from the back surface of the semiconductor substrate 35, is photoelectrically converted, and a signal charge corresponding to red is accumulated.

When a charge is read, a transfer transistor (not illustrated) is turned on. Each transfer transistor is turned on, and the accumulated signal charges (electrons) of the organic photoelectric conversion unit 41, the first photodiode PD 36, and the second photodiode PD 37 are thereby transferred to floating diffusion portions (FD) corresponding thereto. Then, the red, green, and blue pixel signals are read by the vertical signal lines through the other pixel transistors, and are output.

By the way, the above vertical spectral type imaging device needs to use a transparent electrode along with the upper electrode 31 and the lower electrode 33. However, a film formed at a low temperature such as an ALD method includes a large amount of hydrogen in the film, and reduces a work function of ITO due to hydrogen in the film when the ITO is used for the lower electrode 33.

The ALD method reduces a precursor with O3, and therefore a film is formed by oxidization. O3 during film formation may denaturalize or deteriorate the organic photoelectric conversion film 32 and the lower electrode 33.

On the other hand, in order to transport a hole from the organic photoelectric conversion film 32, the lower electrode 33 needs to use a transparent electrode having a high work function, and the upper electrode 31 needs to use a transparent electrode having a low work function. When ITO is used for the lower electrode 33, control is performed so as to obtain a film having a high work function by forming an O-rich film by an oxygen plasma treatment.

As described above, when the lower electrode 33 is denaturalized due to an influence of O3 during film formation, the work function may be reduced, hole transport may be inhibited, and sensitivity may be lowered. That is, when the lower electrode 33 is denaturalized due to an influence of hydrogen or the like, and the work function is reduced, sensitivity is lowered. Therefore, it is necessary to prevent such a situation.

<Configuration of First Imaging Device>

Therefore, as a first embodiment, an imaging device suppressing reduction of a lower electrode 33 by disposing a metal thin film between an upper electrode 31 and an organic photoelectric conversion film 32 will be described.

Figure 3:
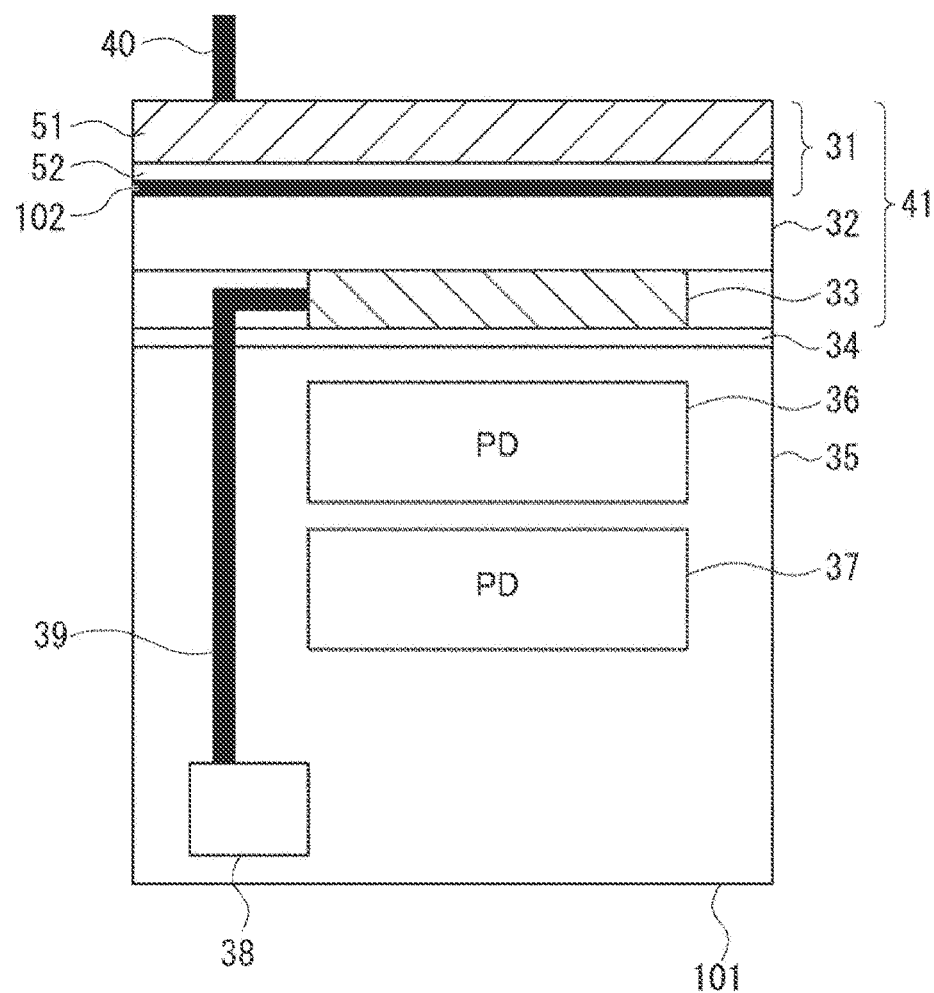
FIG. 3 is a diagram for explaining a configuration of an imaging device according to a first embodiment.

FIG. 3 is a diagram illustrating a configuration of an imaging device having a configuration for protecting the lower electrode 33 from a substance serving as a factor for reducing a work function of hydrogen or the like. The same reference signs are given to the same components as those of the imaging device 21 illustrated in FIG. 2, and description thereof will be omitted appropriately.

An imaging device 101 illustrated in FIG. 3 includes a metal thin film 102 in the upper electrode 31. More specifically, the metal thin film 102 is provided on a lower side of an oxide semiconductor 51 and an aluminum oxide (AlO) thin film 52 forming the upper electrode 31 between the AlO thin film 52 and an organic photoelectric conversion unit 41.

As described above, in the first imaging device, the upper electrode 31 is formed of an oxide semiconductor film, a metal oxide film, and a metal film.

As the metal thin film 102, for example, aluminum (Al) can be used. Aluminum has a low work function. In addition, a work function of the organic photoelectric conversion film 41 on the upper electrode 31 side is preferably set to a low value. Therefore, by providing a film formed of a material having a low work function such as aluminum on the upper electrode 31 side of the organic photoelectric conversion unit 41, it is possible to maintain a low (shallow) work function, to maintain sensitivity, and to improve the sensitivity.

In addition, by providing the metal thin film 102 formed of aluminum or the like, the metal thin film 102 can prevent entrance of hydrogen or the like. That is, in this case, the metal thin film 102 can prevent a substance such as hydrogen from entering the organic photoelectric conversion film 32 from the upper electrode 31 side. Note that the metal thin film 102 is formed so as to have a thickness of 5 nm or less. With such a thickness, the metal thin film 102 can be provided without inhibiting light transmittance or causing sensitivity lowering or the like.

Therefore, it is possible to prevent a substance such as hydrogen from entering the organic photoelectric conversion film 32 or the lower electrode 33 provided on a lower side of the organic photoelectric conversion film 32, and to prevent change of the organic photoelectric conversion film 32 or the lower electrode 33, and reduction of the work function.

Note that the work function of the upper electrode 31 is preferably shallow. Therefore, even when the oxide semiconductor 51 forming the upper electrode 31 is changed due to a substance such as hydrogen, and the work function becomes shallow, sensitivity of the imaging device 101 is not lowered. Therefore, as illustrated in FIG. 3, the metal thin film 102 only needs to be provided not on an upper portion (oxide semiconductor 51) side of the upper electrode 31 but on a lower side (opposite to a light-receiving surface) thereof.

Figure 4:
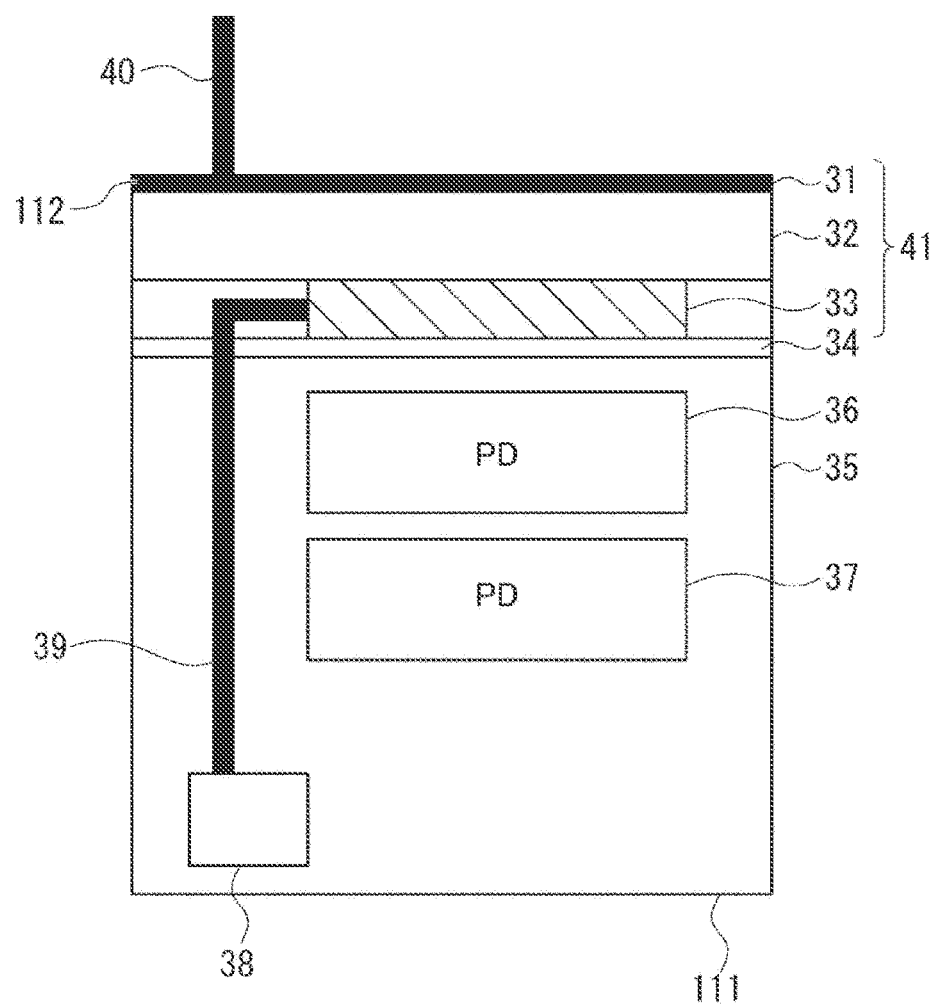
FIG. 4 is a diagram for explaining another configuration of the imaging device according to the first embodiment.

In addition, as illustrated in FIG. 4, the upper electrode 31 may be formed only of the metal thin film 112. In the imaging device 111 illustrated in FIG. 4, the upper electrode 31 is formed of the metal thin film 112. When the metal thin film 112 is formed of aluminum or the like, the metal thin film 112 can function as an electrode. Therefore, the metal thin film 112 may be used as the upper electrode 31.

However, the upper electrode 31 is preferably transparent, and the metal thin film 112 is opaque. Therefore, it is necessary to configure the metal thin film 112 so as to be as thin as possible and to transmit light.

Figure 5:
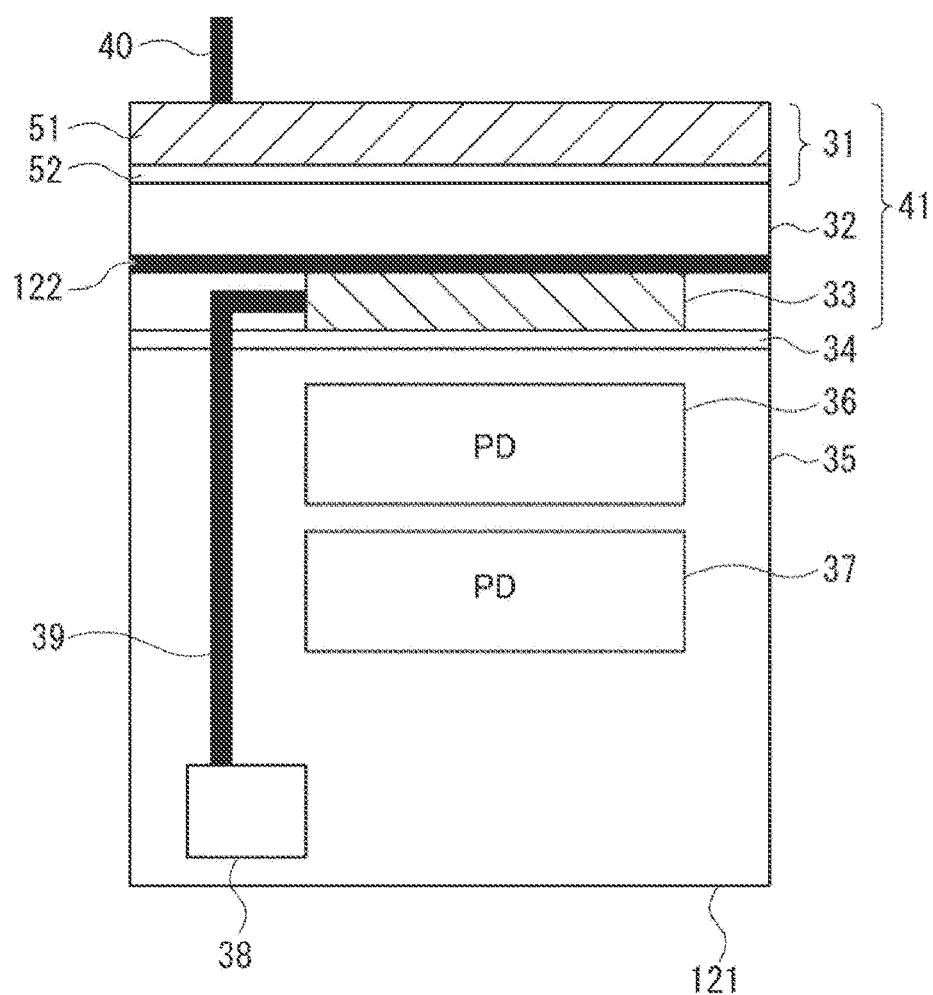
FIG. 5 is a diagram for explaining another configuration of the imaging device according to the first embodiment.

In addition, in order to prevent the work function of the lower electrode 33 from becoming shallow, as illustrated in FIG. 5, the metal thin film 102 may be provided on an upper side of the lower electrode 33. In the imaging device 121 illustrated in FIG. 5, the metal thin film 122 is provided on the upper side of the lower electrode 33 between the lower electrode 33 and the organic photoelectric conversion film 32.

In the imaging device 121, the metal thin film 122 is provided in the upper portion of the lower electrode 33, and therefore it is possible to prevent a substance such as hydrogen from entering the lower electrode 33 and to prevent the lower electrode 33 from being denaturalized.

Incidentally, in a case where the metal thin film 122 is provided on the lower electrode 33 side, when a material of the thin film used as the metal thin film 122 has a deep (high) work function, the work function of the lower electrode 33 is easily maintained in a deep state, and sensitivity of the imaging device 121 can be maintained.

In addition, similarly to the imaging device 111 illustrated in FIG. 4, the lower electrode 33 itself may be formed of the metal thin film 122. Although not illustrated, the metal thin film 122 may be formed of a metal material having a high work function, and may be caused to function as the lower electrode 33.

However, the lower electrode 33 is preferably transparent, and the metal thin film 122 is opaque. Therefore, it is necessary to configure the metal thin film 122 so as to be as thin as possible and to transmit light.

<Manufacturing of Imaging Device>

Manufacturing of the above imaging device will be described. Here, description will be made by exemplifying a case of manufacturing the imaging device 101 illustrated in FIG. 3. Note that the imaging device 111 illustrated in FIG. 4 or the imaging device 121 illustrated in FIG. 5 is basically manufactured through similar steps while the order of the manufacturing steps is changed, a step is added, or some of the steps are omitted.

Figure 6:
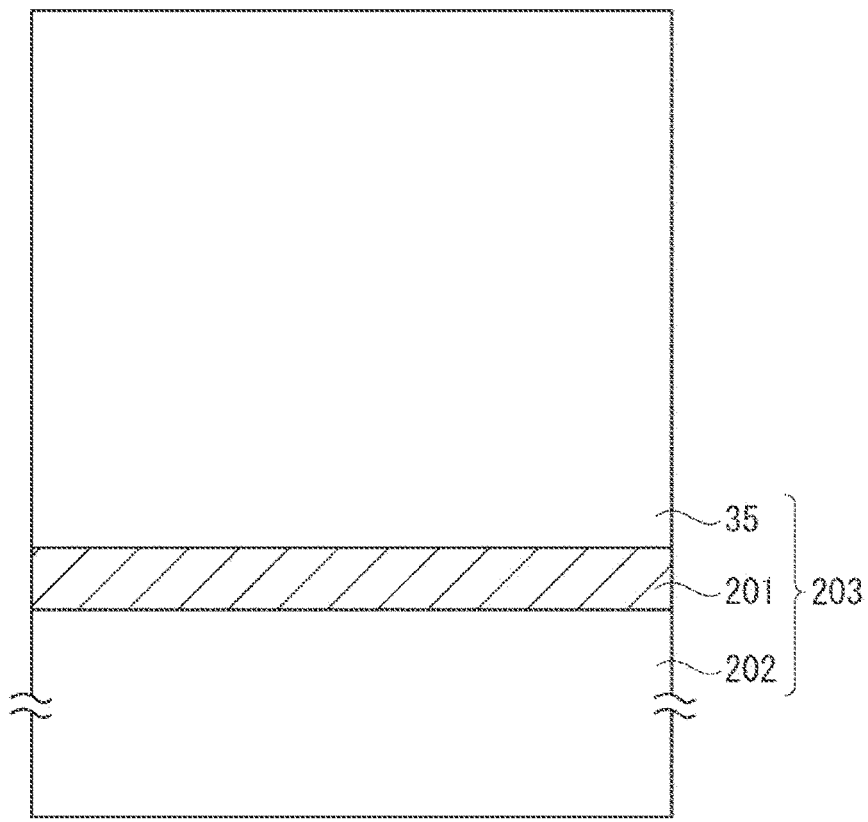
FIG. 6 is a diagram for explaining manufacturing of an imaging device.
Figure 7:
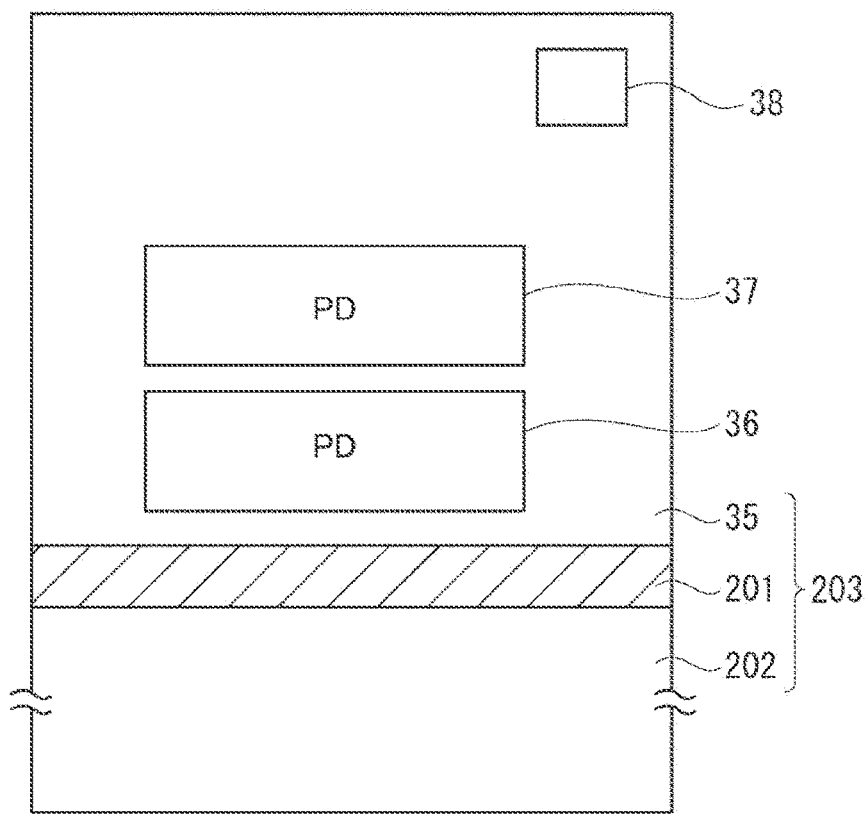
FIG. 7 is a diagram for explaining manufacturing of the imaging device.

First, as illustrated in FIG. 6, a so-called SOI substrate 203 in which a silicon layer 35 is formed on a silicon substrate 202 through a silicon oxide film 201 is prepared. Note that the silicon layer 35 corresponds to the above semiconductor substrate 35. The silicon layer 35 is formed of an n-type silicon layer.

Subsequently, the first photodiode PD 36 for a second color and the second photodiode PD 37 for a third color are formed so as to be stacked on each other at different positions in the depth in the silicon layer 35. In this example, the first photodiode PD 36 is formed as a photodiode absorbing blue wavelength light. The second photodiode PD 37 is formed as a photodiode absorbing red wavelength light.

The first photodiode PD 36 is formed by forming a p-type semiconductor region serving as a hole accumulation layer and an n-type semiconductor region serving as a charge accumulation layer on a back surface side of the silicon layer 35 by ion implantation so as to form a pn junction.

An n-type semiconductor region serving as a charge accumulation layer is formed on a surface side of the silicon layer 35 by ion implantation so as to form a pn junction, and the second photodiode PD 37 is formed of the n-type semiconductor region and a p-type semiconductor region in a lower layer.

Figure 8:
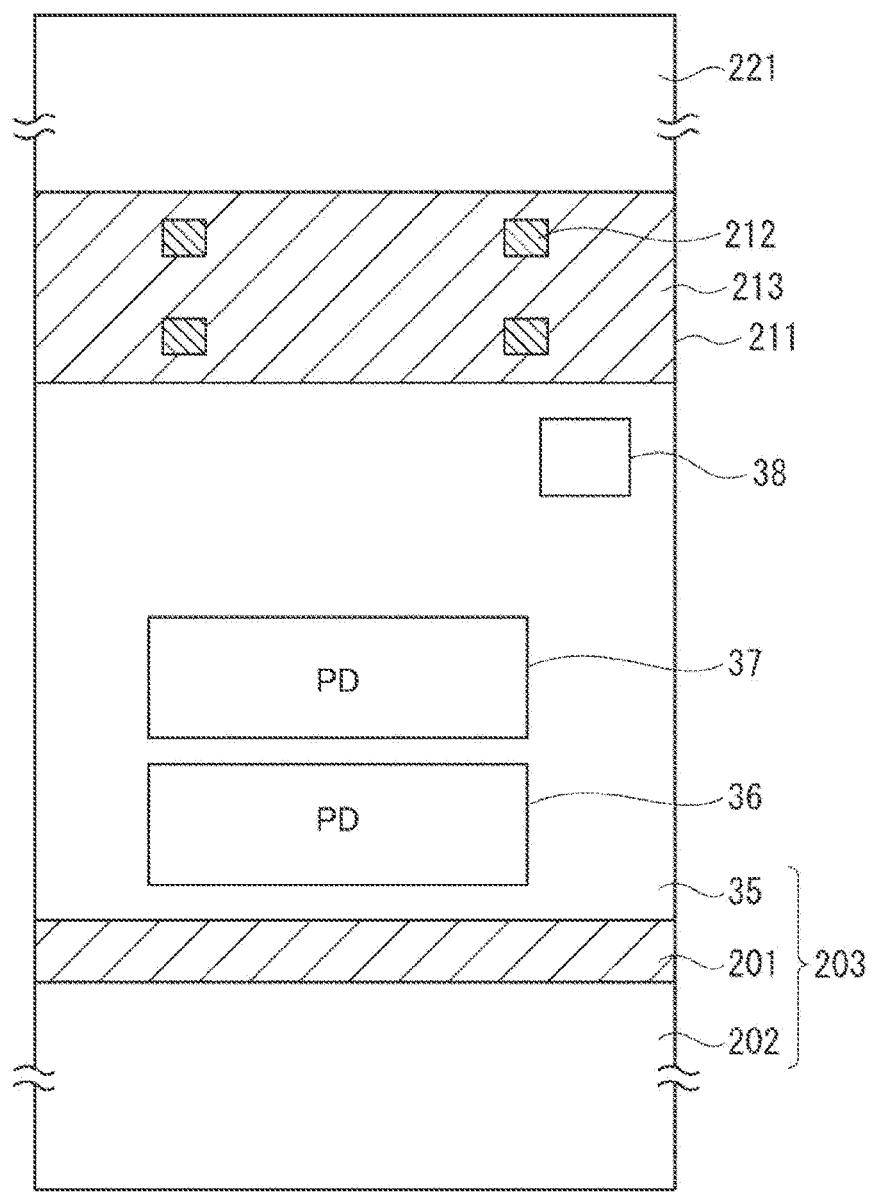
FIG. 8 is a diagram for explaining manufacturing of the imaging device.

Subsequently, as illustrated in FIG. 8, a multilayer wiring layer 211 disposed with a plurality of layers of wiring 212 through an interlayer insulating film 213 is formed on a surface of the silicon layer 35.

In this example, as the first and second photodiodes PD36 and PD37, photodiodes absorbing red and blue wavelength light have been exemplified. However, as described above, the combination is not necessarily limited to the two colors of blue and red.

Subsequently, as illustrated in FIG. 8, a supporting substrate 221 is attached onto the multilayer wiring layer 211. Examples of the supporting substrate 221 include a silicon substrate.

Figure 9:
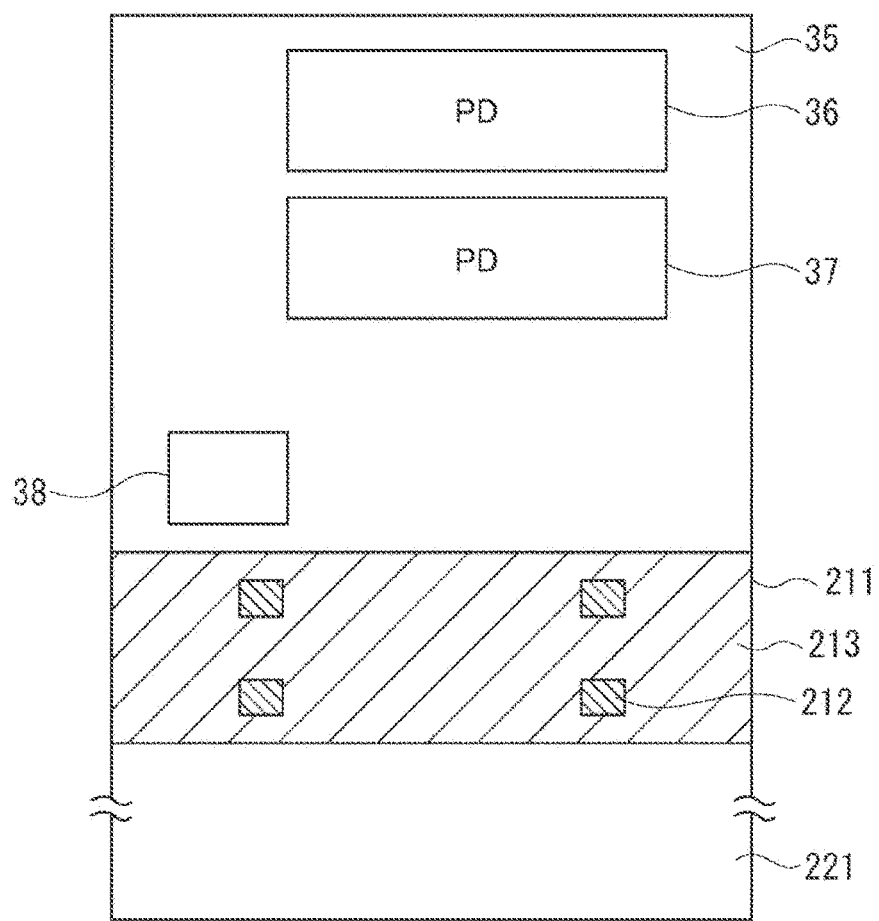
FIG. 9 is a diagram for explaining manufacturing of the imaging device.

Subsequently, as illustrated in FIG. 9, the silicon substrate 202 as the initial SOI substrate 203 and the silicon oxide film 201 are removed, and a back surface of the thin silicon layer 35 is exposed.

Figure 10:
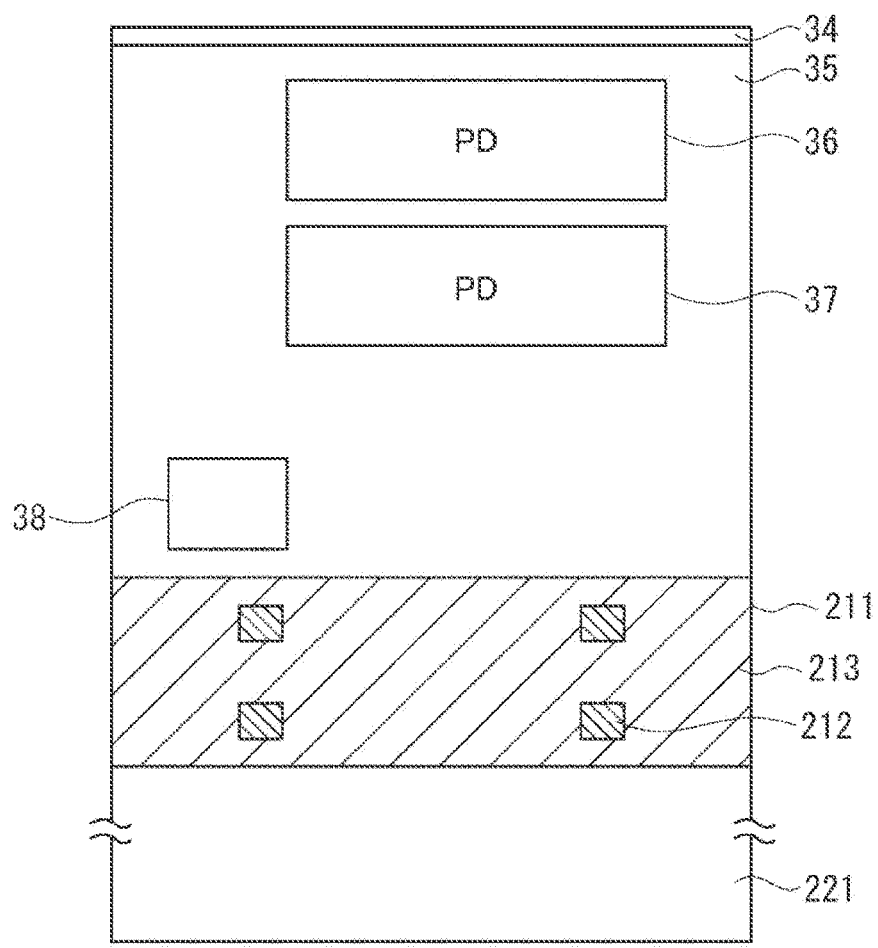
FIG. 10 is a diagram for explaining manufacturing of the imaging device.

Subsequently, as illustrated in FIG. 10, the insulating film 34 is formed on the back surface of the silicon layer 35. This insulating film 34 is provided in order to reduce an interface state between the insulating film 34 and the silicon layer 35 and to suppress generation of a dark current from an interface between the silicon layer 35 and the insulating film 34. The interface state is preferably small.

As the insulating film 34, for example, a stacked structure film formed of a hafnium oxide (HfO2) film formed by an ALD (atomic layer deposition) method and a silicon oxide (SiO2) film formed by a plasma CVD (chemical vapor deposition) method can be used. Note that other structures or other film formation methods can be used without being limited to the structure and film formation method described here.

Figure 11:
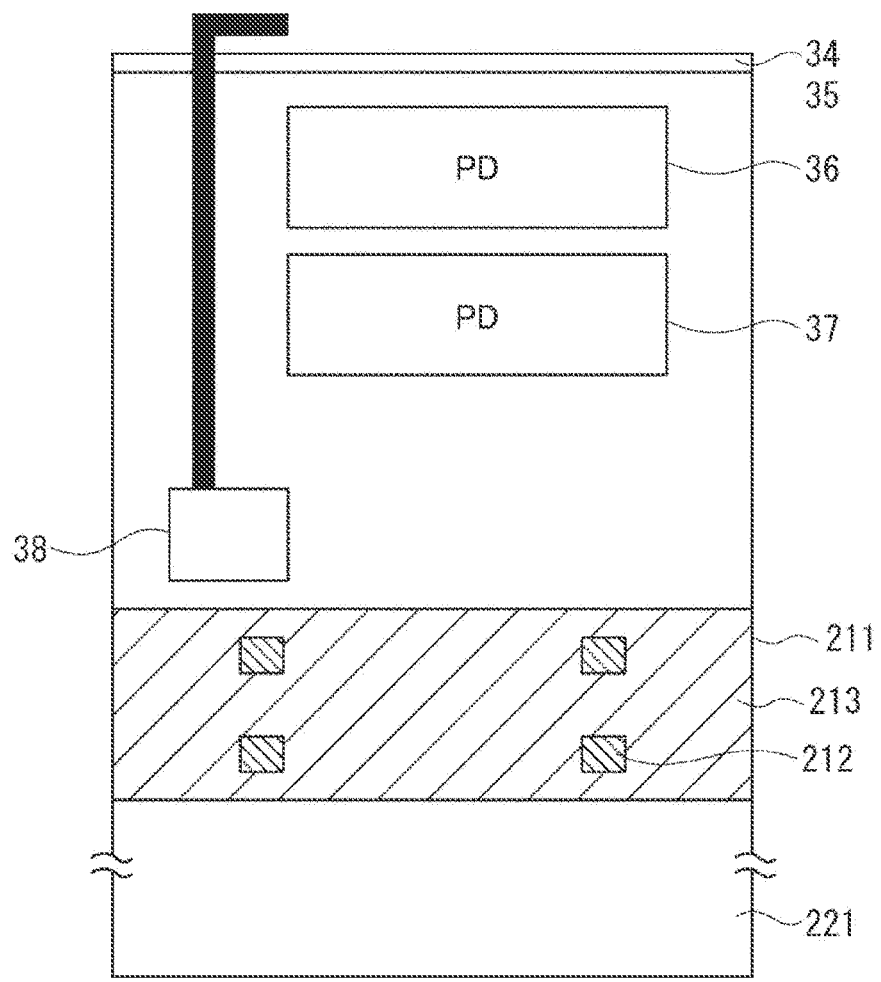
FIG. 11 is a diagram for explaining manufacturing of the imaging device.

Subsequently, as illustrated in FIG. 11, the wiring 39 also serving as a light-shielding film is formed on the silicon layer 35. The wiring 39 is processed so as to leave a part to be light-shielded. The wiring 39 needs to be in contact with silicon (Si), and is used also as a light-shielding film, and therefore a stacked film formed of a barrier metal Ti and TiN, and tungsten (W) can be used therefor. However, the wiring 39 is not necessarily limited to the structure and the materials.

Figure 12:
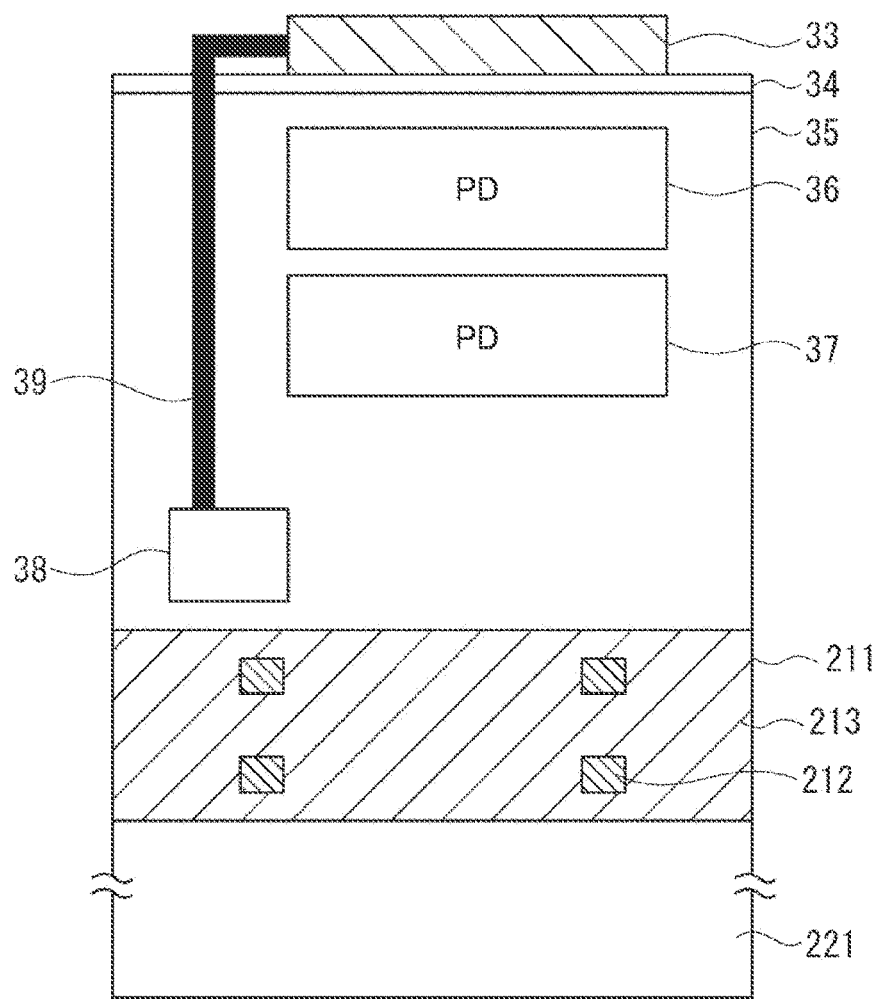
FIG. 12 is a diagram for explaining manufacturing of the imaging device.

Subsequently, as illustrated in FIG. 12, the lower electrode 33 serving as a lower electrode of the organic photoelectric conversion unit 41 is formed. For example, the lower electrodes 33 are electrically insulated from each other by an insulating film such as a SiO2 film formed by a plasma CVD method, and flattening is performed by CMP or the like.

It is required for the lower electrode 33 to transmit light. Therefore, for example, a film of ITO is formed by a sputtering method, then patterning is performed by a photolithography technique, and processing is performed by dry etching or wet etching.

Note that a material of the lower electrode 33 is not limited to ITO. Examples thereof include tin oxide-based SnO2 (a dopant is added), zinc oxide-based materials aluminum zinc oxide (Al is added as a dopant to ZnO, for example, AZO), gallium zinc oxide (Ga is added as a dopant to ZnO, for example, GZO), and indium zinc oxide (In is added as a dopant to ZnO, for example, IZO), IGZO, CuI, InSbO4, ZnMgO, CuInO2, MgIn2O4, CdO, and ZnSnO3.

Note that the lower electrode 33 is electrically connected to a charge accumulation layer 38 through the wiring 39. In addition, either of the wiring 39 and the lower electrode 33 may be patterned first.

Figure 13:
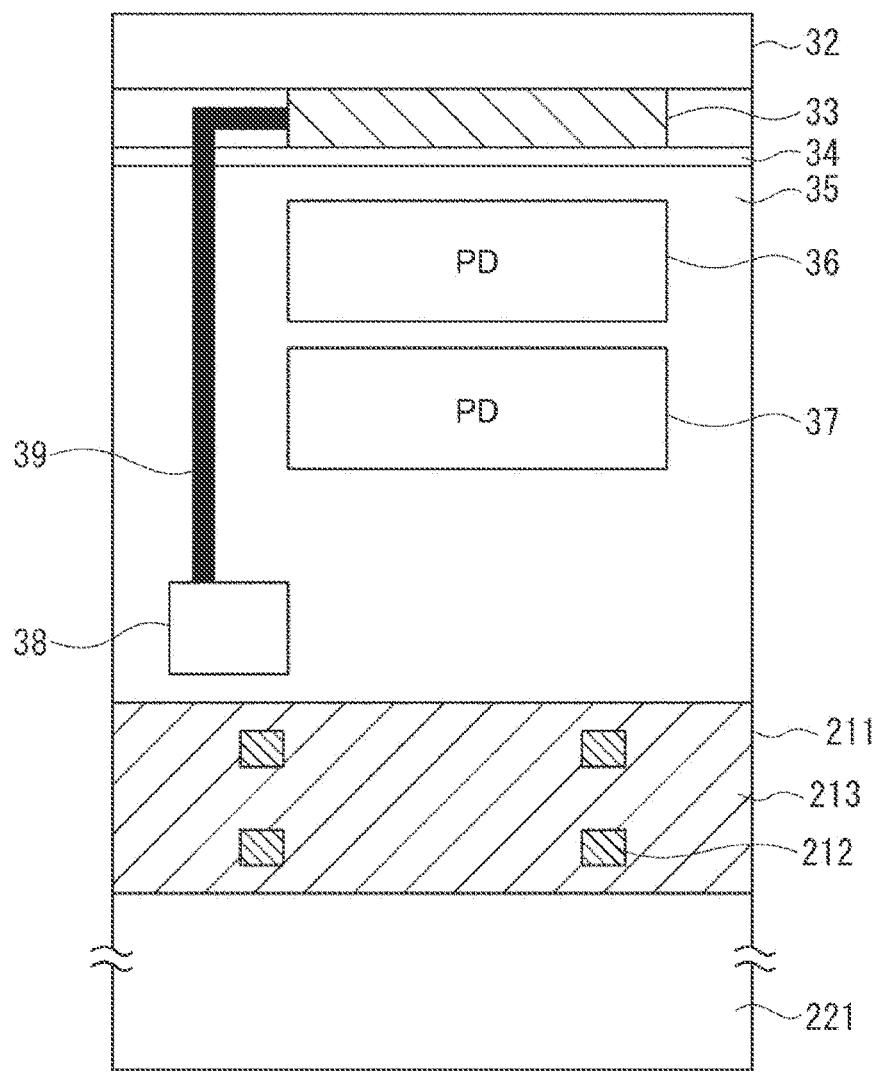
FIG. 13 is a diagram for explaining manufacturing of the imaging device.

Subsequently, as illustrated in FIG. 13, the organic photoelectric conversion film 32 is formed. For example, the organic photoelectric conversion film 32 can be formed of quinacridone by a vacuum vapor deposition method. This example also includes a case where the organic photoelectric conversion film 32 is formed by stacking an electron blocking and buffer film, a photoelectric conversion film, a hole blocking film, a hole blocking and buffer film, and a work function adjusting film on the lower electrode 33.

In addition, the organic photoelectric conversion film 32 only needs to include at least one of an organic p-type semiconductor and an organic n-type semiconductor, but may have a pin bulk hetero structure including a p-type blocking layer, a co-vapor deposition layer of a p-type and an n-type, and an n-type blocking layer.

Examples of the organic p-type semiconductor and the organic n-type semiconductor include a quinacridone derivative, a naphthalene derivative, an anthracene derivative, a phenanthrene derivative, a tetracene derivative, a pyrene derivative, a perylene derivative, and a fluoranthene derivative.

In addition, a polymer of phenylene vinylene, fluorene, carbazole, indole, pyrene, pyrrole, picoline, thiophene, acetylene, diacetylene or the like, and a derivative thereof are used. In addition, for example, a metal complex dye, a cyanine dye, a merocyanine dye, a phenylxanthene dye, a triphenylmethane dye, a rhodacyanine dye, a xanthene dye, a macrocyclic azaanulene dye, an azulene dye, naphthoquinone, an anthraquinone dye, a condensed polycyclic aromatic compound such as anthracene or pyrene, a chain compound obtained by condensing an aromatic ring or heterocyclic compound, a heterocyclic ring compound containing two nitrogen atoms and having a squarylium group and a croconic methine group as a bonding chain, such as quinoline, benzothiazole, or benzoxazole, or a cyanine-like dye bonded by a squarylium group and a croconic methine group can be used.

In addition, examples of the metal complex dye include a dithiol metal complex dye, a metal phthalocyanine dye, a metal porphyrin dye, and a ruthenium complex dye. Note that a dye not illustrated here may be used.

Note that the organic photoelectric conversion film 32 can be formed also by a coating method.

Figure 14:
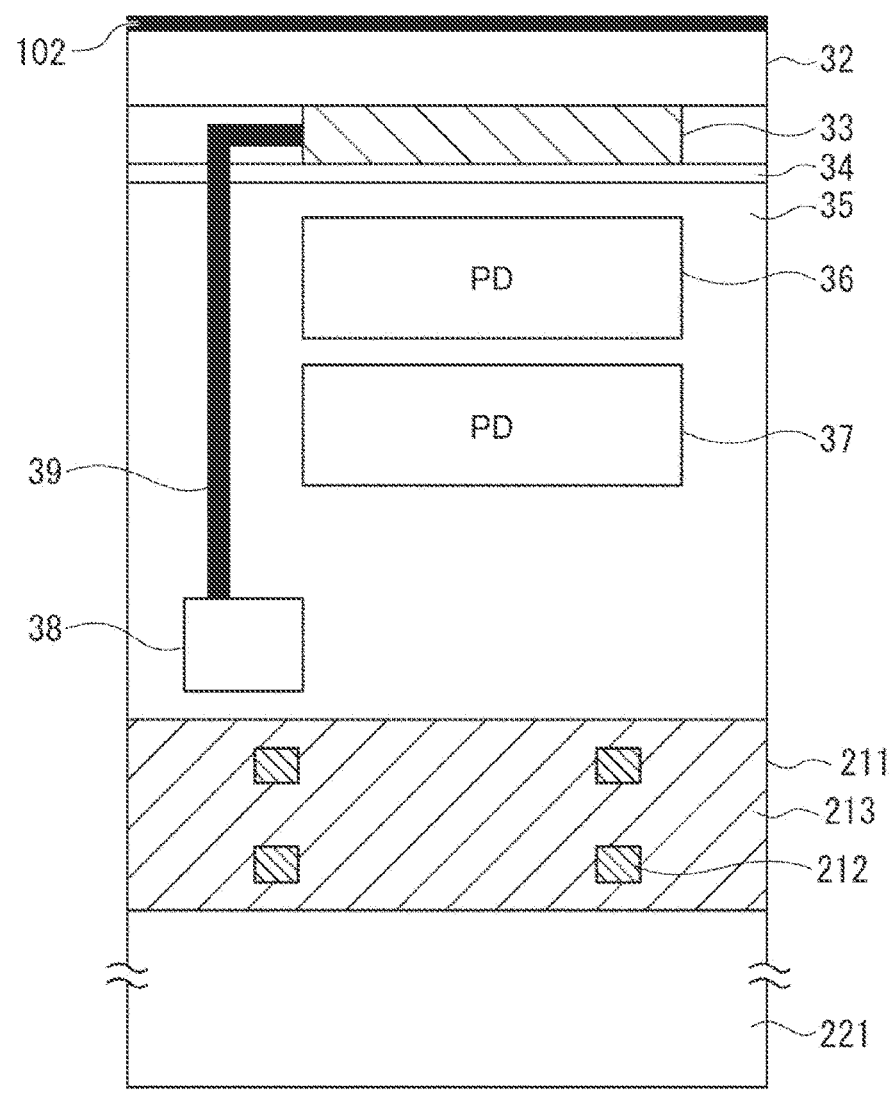
FIG. 14 is a diagram for explaining manufacturing of the imaging device.
Figure 15:
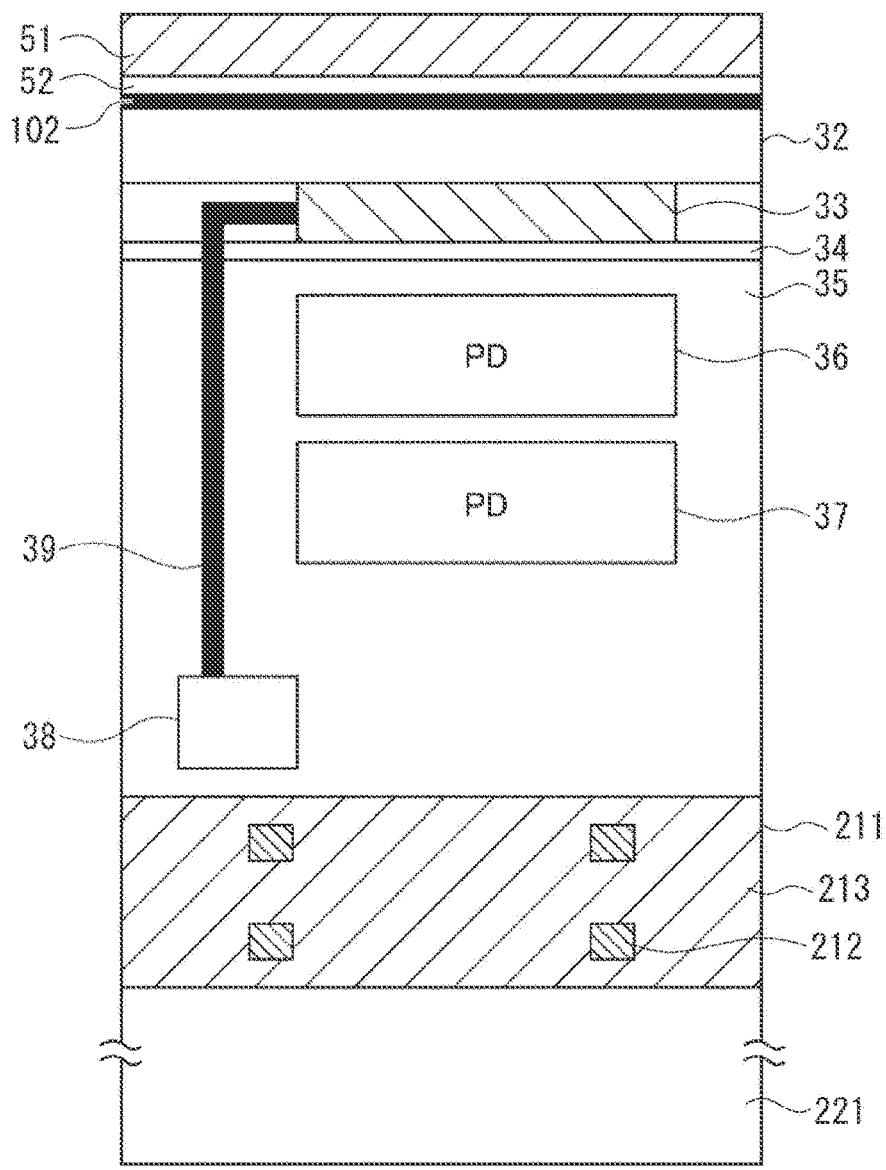
FIG. 15 is a diagram for explaining manufacturing of the imaging device.

Subsequently, as illustrated in FIGS. 14 and 15, the upper electrode 31 is formed on the organic photoelectric conversion film 32. Characteristics of the organic photoelectric conversion film 32 may fluctuate due to an influence of moisture, oxygen, hydrogen, or the like, as described above. Therefore, a film of the upper electrode 31 is formed consistently with the organic photoelectric conversion film 32 in vacuum. Here, as described with reference to FIG. 3, the upper electrode 31 is formed of the metal thin film 102, the AlO thin film 52, and the oxide semiconductor 51.

For example, the metal thin film 102 can be an Al film made of aluminum (Al), and for example, can be formed by a vacuum vapor deposition method. Al has a shallow work function of about 4.3 eV, and is one of materials suitable for a material in contact with the organic photoelectric conversion film 32.

In addition to Al, examples of a material which can be used as the metal thin film 102 include indium (In), silver (Ag), gold (Au), zinc (Zn), lithium (Li), tin (Sn), antimony (Sb), magnesium (Mg), cadmium (Cd), calcium (Ca), potassium (K), rubidium (Rb), cesium (Cs), strontium (Sr), barium (Ba), cerium (Ce), yttrium (Y), hafnium (Hf), nickel (Ni), gallium (Ga), and titanium (Ti).

Each of these materials may be used singly as the metal thin film 102, these materials may form the metal thin film 102 as a plurality of compounds, or a compound formed of a material which has been listed here and a material which has not been listed here may be used as the metal thin film 102.

Subsequently, the AlO film 52 is formed. For example, when the oxide semiconductor 51 is formed by a sputtering method after the metal thin film 102 is formed of Al, the metal thin film 102 is oxidized by energy of a sputtered particle, and the AlO thin film 52 can be formed easily so as to have a thickness of about several nm. For example, the AlO thin film 52 is formed so as to have a thickness of 20 nm or less.

Here, it has been described that the AlO thin film 52 is formed by oxidizing Al with energy of a sputtered particle. However, the AlO thin film 52 may be formed by an ALD method, a CVD method, or the like without being limited thereto.

Note that the AlO thin film 52 is an insulating film, but generally has a sufficiently wide photoelectric conversion area (area of the upper electrode 31) with respect to the thickness of the AlO film 52, and therefore can take sufficient electrical conduction by a thermal diffusion component. It is known that an Al film or an AlO film formed in this manner has a high passivation property with respect to hydrogen. Hydrogen generated during a process can be shielded, and fluctuation of the work function of the lower electrode 33 can be suppressed.

In addition, when Al is used as the metal thin film 102, for example, the remaining metal thin film 102 preferably has a thickness of 5 nm or less. This is because sufficient light transmittance can be ensured in a thin film region of 5 nm or less although Al has high a light-shielding property.

Subsequently, the oxide semiconductor 51 forming a part of the upper electrode 31 is formed. The oxide semiconductor 51 is also required to be transparent with respect to visible light. Here, the description has been made by exemplifying ITO, but the oxide semiconductor 51 is not limited to ITO. Examples thereof include tin oxide-based SnO2 (a dopant is added), zinc oxide-based materials aluminum zinc oxide (Al is added as a dopant to ZnO, for example, AZO), gallium zinc oxide (Ga is added as a dopant to ZnO, for example, GZO), and indium zinc oxide (In is added as a dopant to ZnO, for example, IZO), IGZO, CuI, InSbO4, ZnMgO, CuInO2, MgIn2O4, CdO, and ZnSnO3.

The upper electrode 31 is formed, and then for example, patterning is performed by a photolithography technique. Then, the upper electrode 31 and the organic photoelectric conversion film 32 are processed by dry etching. Thereafter, post-processing such as ashing or organic cleaning is performed, and a deposit and a residue are removed.

Note that description has been made by exemplifying a case where patterning is performed by photolithography and a dry etching method. However, patterning can be performed by using a shadow mask or the like.

Thereafter, the wiring 40 for electrical connection with a passivation film (not illustrated) or the upper electrode 31 is formed. When patterning is performed by a dry etching method, a sidewall of the organic photoelectric conversion film 32 is brought into direct contact with the passivation film. However, the lower electrode 33 is sufficiently separated from the passivation film, and therefore there is almost no influence. In addition, examples of the wiring 40 include tungsten (W), a barrier metal Ti, TiN, and aluminum (Al), but are not limited thereto.

For example, the wiring 40 is formed by performing patterning by a photolithography technique, performing processing by dry etching, performing post-processing such as ashing or organic cleaning, and removing a deposit and a residue. Thereafter, although not illustrated, a flattened film, an on-chip lens, or the like is formed.

The imaging device 101 is manufactured in this manner. Therefore, hydrogen during a manufacturing process can be shielded so as not to enter the lower electrode 33, and fluctuation of the work function of the lower electrode 33 can be suppressed.

Note that this example has exemplified the structure obtained by stacking blue and red photoelectric conversion regions in silicon and stacking a green photoelectric conversion unit on an upper layer of the silicon. However, the scope of the present technology is not limited to such a structure. In addition, description has been made by exemplifying a back surface irradiation type CMOS imager structure. However, the scope of the present technology is not limited to such a structure.

<Configuration of Second Imaging Device>

Figure 16:
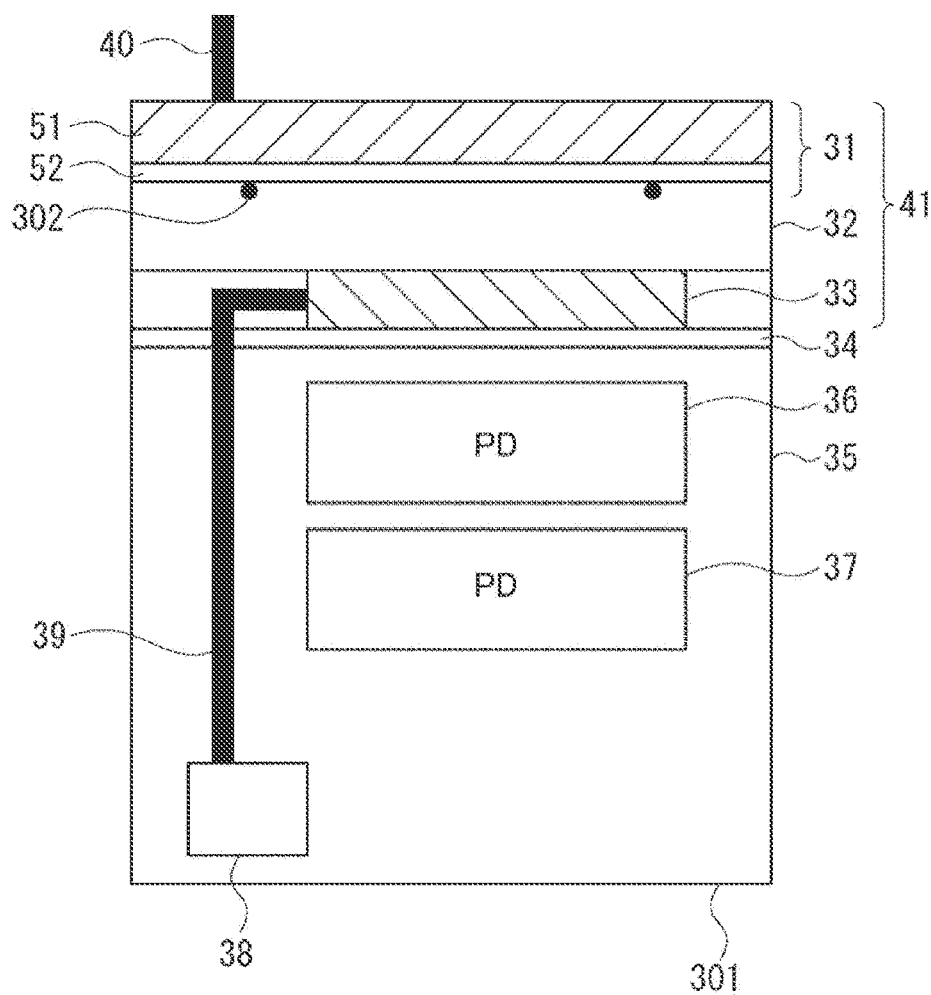
FIG. 16 is a diagram for explaining a configuration of an imaging device according to a second embodiment.

Next, a configuration of an imaging device according to a second embodiment will be described. FIG. 16 is a diagram illustrating the configuration of the imaging device according to the second embodiment. In an imaging device 301 illustrated in FIG. 16, similar reference signs are given to similar components to those of the imaging device 101 illustrated in FIG. 3, and description thereof will be omitted.

The metal thin film 102 of the imaging device 101 (FIG. 3) according to the first embodiment is formed into a film shape. However, the imaging device 301 according to the second embodiment is different therefrom in that a film is not formed in the imaging device 301. Here, a metal electrode 302 is described. As illustrated in FIG. 16, the metal electrode 302 is provided on a lower side of an AlO film 52 on an organic photoelectric conversion film 32 side, and is provided in a scattered manner.

In other words, the metal electrode 302 forming the upper electrode 31 can have a configuration remaining not in a shape of a film but at an atomic level. Also in the case of this configuration, AlO is present as the AlO film 52, and therefore a passivation property is ensured.

Figure 17:
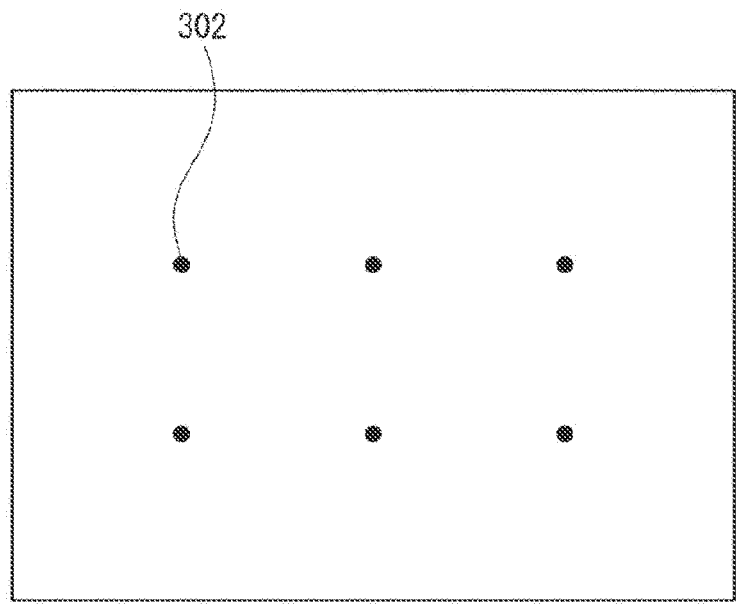
FIG. 17 is a diagram for explaining the configuration of the imaging device according to the second embodiment.

When the imaging device 301 is viewed from above, as illustrated in FIG. 17, the metal electrode 302 is present. The metal electrode 302 may have a spherical shape, a quadrangle shape, or the like, and the shape thereof is not particularly limited. In addition, the metal electrode 302 may be disposed at regular intervals, or may be disposed at random intervals.

Figure 18:
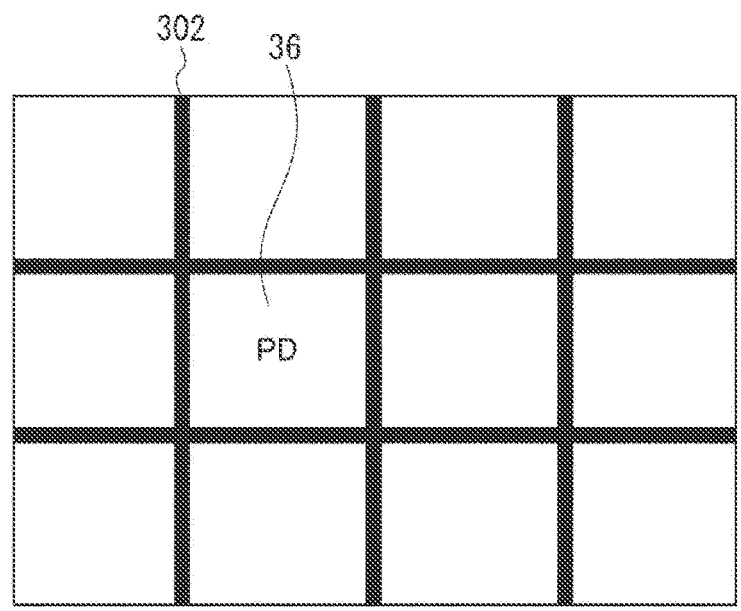
FIG. 18 is a diagram for explaining the configuration of the imaging device according to the second embodiment.

In addition, as illustrated in FIG. 18, the metal electrode 302 may be formed into a lattice shape. When the metal electrode 302 is formed into a lattice shape, the metal electrode 302 may be formed such that a first photodiode PD 36 is located in a lattice. In other words, the metal electrode 302 may be formed so as to be located between the photodiodes.

When the metal electrode 302 is formed into a lattice shape, the metal electrode 302 can have a light-shielding function. That is, by forming the metal electrode 302 into a lattice shape, forming the metal electrode 302 so as to have a width and a thickness capable of obtaining a light-shielding function, and forming the metal electrode 302 at a position at which the amount of light incident on a photodiode or the like is not reduced, the metal electrode 302 can be caused to function as a light-shielding film (light-shielding wall).

Note that when the metal electrode 302 is formed so as to have a predetermined shape such as a lattice shape, the metal electrode 302 can be formed by applying patterning, a shadow mask, or the like.

<Configuration of Third Imaging Device>

Figure 19:
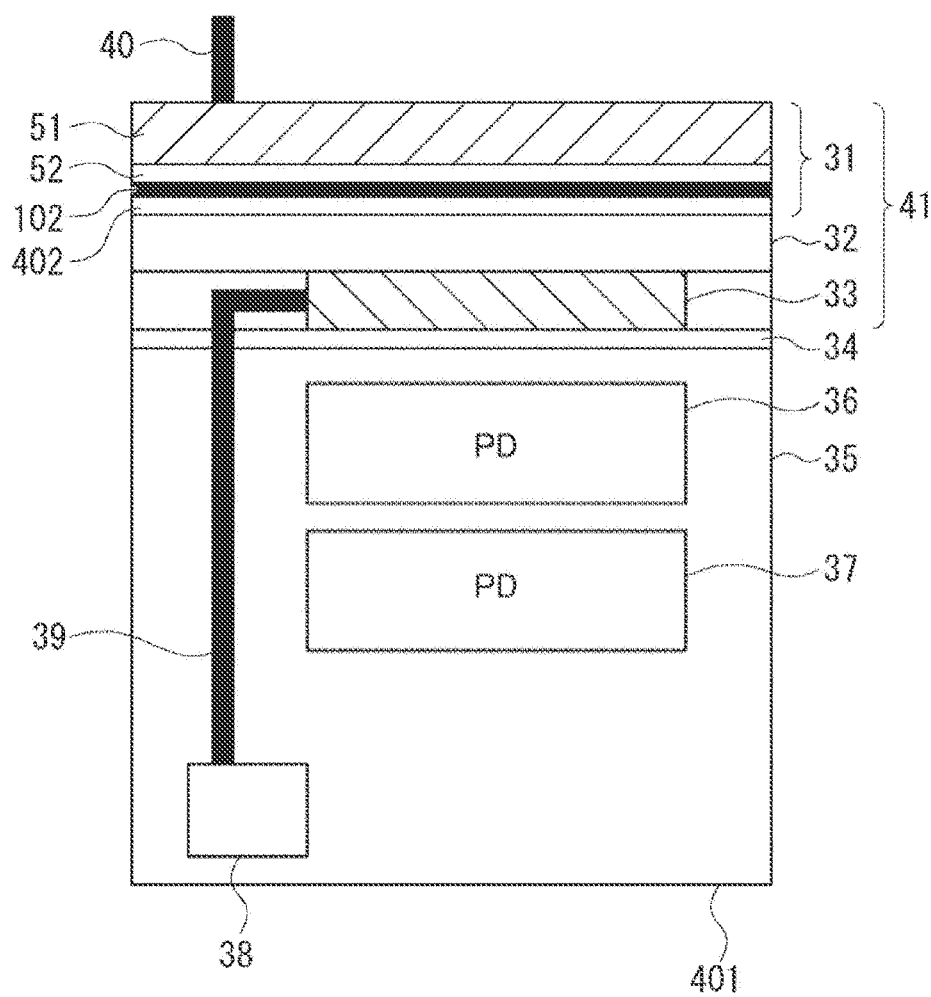
FIG. 19 is a diagram for explaining a configuration of an imaging device according to a third embodiment.

Next, a configuration of an imaging device according to a third embodiment will be described. FIG. 19 is a diagram illustrating the configuration of the imaging device according to the third embodiment. In an imaging device 401 illustrated in FIG. 19, similar reference signs are given to similar components to those of the imaging device 101 illustrated in FIG. 3, and description thereof will be omitted.

The imaging device 401 according to the third embodiment includes a hole blocking layer. In the imaging device 401 illustrated in FIG. 19, a hole blocking layer 402 is provided as a part of an upper electrode 31, and is provided on a lower side of a metal thin film 102 between the metal thin film 102 and an organic photoelectric conversion film 32.

The hole blocking layer 402 is formed of a material such as lithium fluoride (LiF) or magnesium oxide (MgO). Even when the upper electrode 31 including the metal thin film 102 is stacked, a similar effect can be obtained, and a dark current can be reduced.

Note that here, the configuration in which the hole blocking layer 402 is provided in the imaging device 101 illustrated in FIG. 3 has been described. However, the hole blocking layer 402 may be provided in the imaging device 111 illustrated in FIG. 4. Although not illustrated, when the hole blocking layer 402 is provided in the imaging device 111, the hole blocking layer 402 is provided between the metal thin film 122 and the organic photoelectric conversion film 32.

In addition, the hole blocking layer 402 may be provided in the imaging device 121 illustrated in FIG. 5. Although not illustrated, when the hole blocking layer 402 is provided in the imaging device 121, the hole blocking layer 402 is provided between an AlO film 52 and the organic photoelectric conversion film 32.

In addition, the hole blocking layer 402 may be provided in the imaging device 301 illustrated in FIG. 16. Although not illustrated, when the hole blocking layer 402 is provided in the imaging device 301, the hole blocking layer 402 is provided between the AlO film 52 and the organic photoelectric conversion film 32. In this case, a metal electrode 302 may be provided in the same layer as the hole blocking layer 402, or the metal electrode 302 may be provided between the hole blocking layer 402 and the organic photoelectric conversion film 32.

<Configuration of Fourth Imaging Device>

Figure 20:
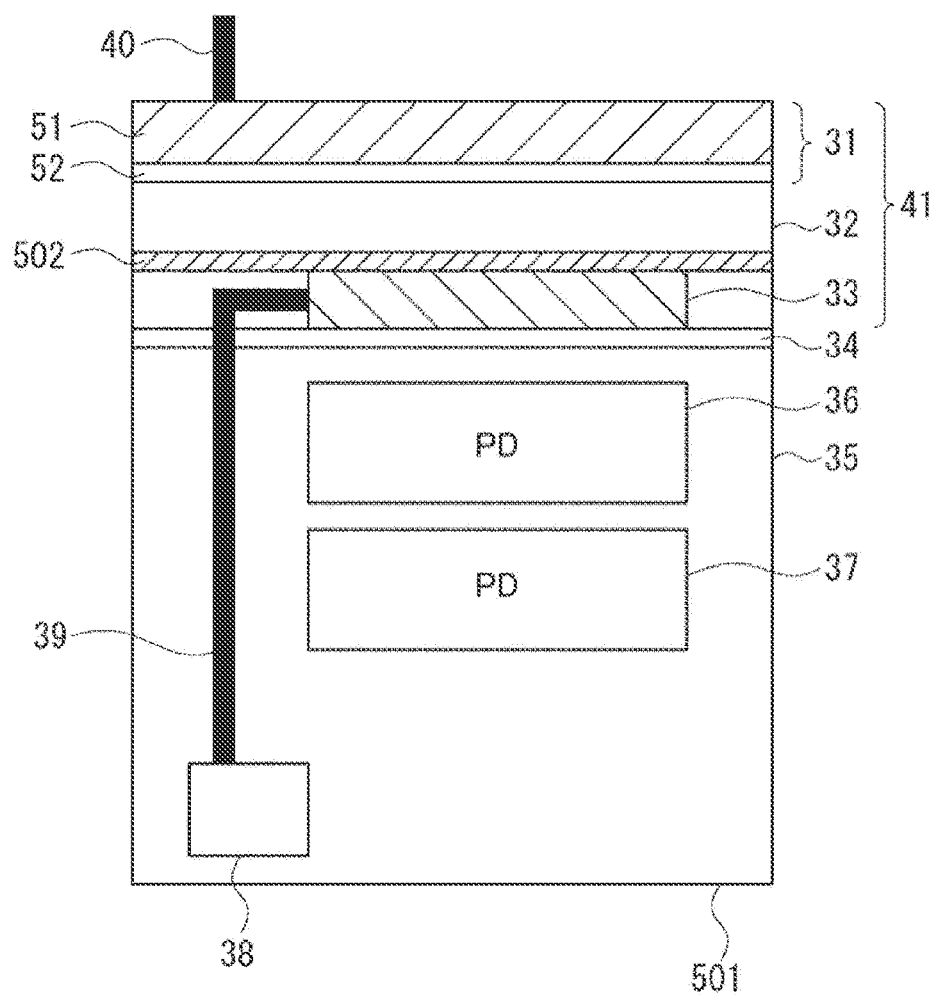
FIG. 20 is a diagram for explaining a configuration of an imaging device according to a fourth embodiment.

Next, a configuration of an imaging device according to a fourth embodiment will be described. FIG. 20 is a diagram illustrating the configuration of the imaging device according to the fourth embodiment. In an imaging device 501 illustrated in FIG. 20, similar reference signs are given to similar components to those of the imaging device 101 illustrated in FIG. 3, and description thereof will be omitted.

The imaging device 501 according to the fourth embodiment includes an enthalpy control layer. In the imaging device 501 illustrated in FIG. 20, an enthalpy control layer 502 is provided on an upper side of a lower electrode 33 between an organic photoelectric conversion film 32 and the lower electrode 33.

For example, the enthalpy control layer 502 is formed as an oxide film containing cadmium (Cd), copper (Cu), lead (Pb), palladium (Pd), or the like. In FIG. 21, materials which can be used as the enthalpy control layer 502 are listed. As illustrated in FIG. 21, the enthalpy control layer 502 can be formed of any one of Ag2O, CoO, Co3O4, CdO, Cs2O, CuO, Cu2O, GeO(c), GeO2(c1), GeO2(c2), NiO(c), PbO(c), PbO2(c2), PbO2(c), PdO(c), Rb2O(c), Rb2O2(c), SeO2(c), SeO3(c), TeO2 (C), Tl2O(c), and Tl2O3(c).

In FIG. 21, in the column of a transparent electrode, a material which can be used for the lower electrode 33 is described. In the column of a composition, the name of a substance (element symbol) for forming the material described in the column of the transparent electrode is described. In the column of a composition of an enthalpy control layer, the name of a substance (element symbol) forming a material which can be used as a material of the enthalpy control layer 502 is described. In addition, a numerical value described in association with each element symbol is a numerical value of a standard enthalpy of formation.

When the enthalpy control layer 502 is provided, like the imaging devices according to the first to third embodiments, it is possible to prevent the lower electrode 33 from being denaturalized, and to prevent a work function from becoming shallow, for example.

This indicates that in a case where the lower electrode 33 is formed of ITO, for example, when the enthalpy control layer 502 is formed of a film of copper oxide (CuO), the standard enthalpy of formation (−157.3 from FIG. 21) of copper oxide is higher than the standard enthalpy of formation (−280.71 from FIG. 21) of tin oxide (SnO) forming the ITO, and therefore the enthalpy control layer 502 is reduced selectively.

Therefore, hydrogen does not enter the lower electrode 33, and fluctuation of a work function can be suppressed. Note that the enthalpy control layer 502 having a thickness of 5 nm is sufficient.

As described above, by providing the enthalpy control layer 502 in the lower electrode 33, it is possible to prevent a substance such as hydrogen from entering the lower electrode 33, and to prevent a work function of the lower electrode 33 from being changed.

Note that the enthalpy control layer 502 may be provided in any one of the above imaging devices according to the first to third embodiments. That is, the imaging device can be formed of a combination of any one of the metal thin film 102 (FIG. 3), the metal thin film 112 (FIG. 4), the metal thin film 122 (FIG. 5), the metal electrode 302 (FIG. 16), and the hole blocking layer 402 (FIG. 19), and the enthalpy control layer 502.

<Configuration of Electronic Apparatus>

The above imaging device can be applied to any electronic apparatus using a semiconductor device for an image capturing unit (photoelectric conversion unit), such as an imaging device including a digital still camera and a video camera, a mobile terminal device having an imaging function, including a portable telephone device, or a copying machine using an imaging device for an image reader.

Figure 22:
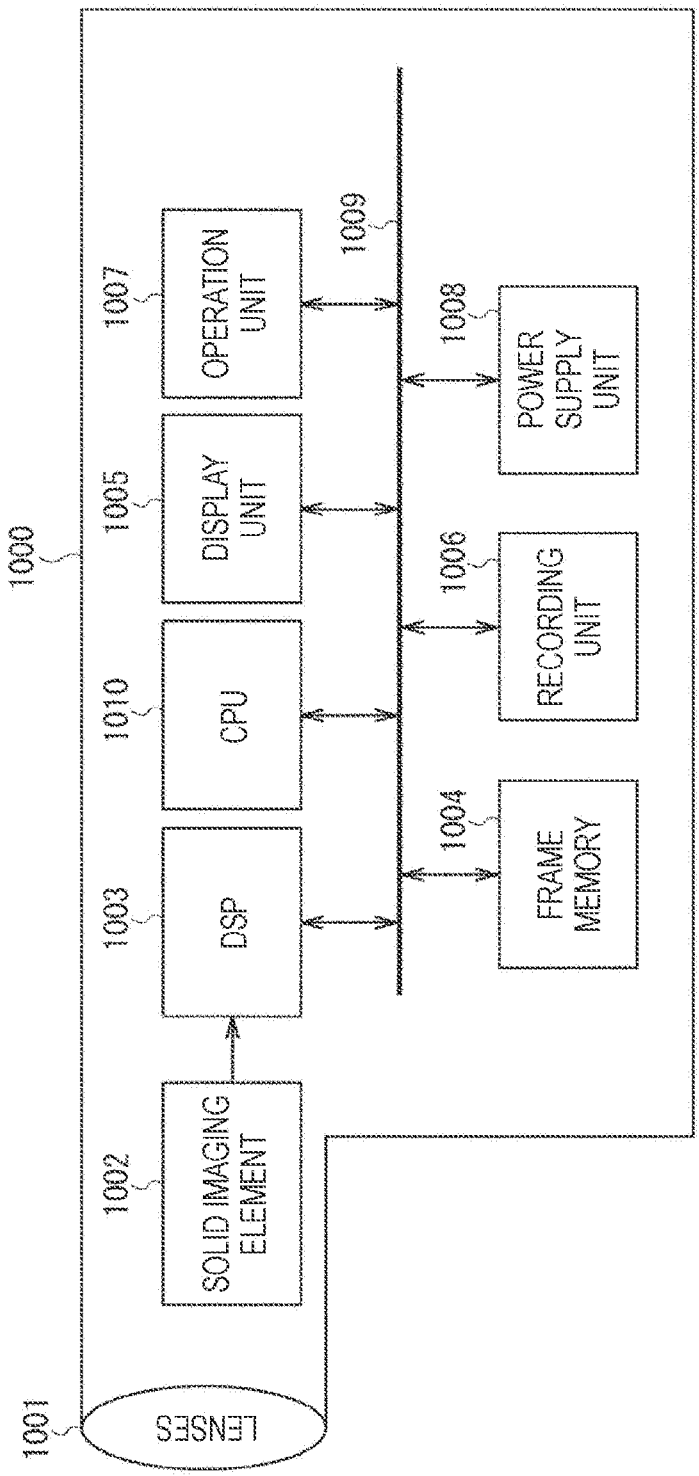
FIG. 22 is a diagram for explaining a configuration of an electronic apparatus.

FIG. 22 is a block diagram exemplifying a structure of an electronic apparatus according to the present technology, for example, an imaging device. As illustrated in FIG. 22, an imaging device 1000 according to the present technology includes an optical system including lenses 1001 or the like, an imaging element (imaging device) 1002, a DSP circuit 1003, a frame memory 1004, a display device 1005, a recording device 1006, an operation system 1007, a power supply system 1008, and the like. In addition, the DSP circuit 1003, the frame memory 1004, the display device 1005, the recording device 1006, the operation system 1007, and the power supply system 1008 are connected to one another through a bus line 1009.

The lenses 1001 capture incident light (image light) from a subject to form an image on an imaging surface of the imaging element 1002. The imaging element 1002 converts the amount of the incident light an image of which has been formed on the imaging surface by the lenses 1001 into an electrical signal in a pixel unit, and outputs the electrical signal as a pixel signal.

The display device 1005 is formed of a panel display device such as a liquid crystal display device or an organic electro luminescence (EL) display device, and displays a moving image or a still image formed by the imaging element 1002. The recording device 1006 records the moving image or the still image formed by the imaging element 1002 in a recording medium such as a digital versatile disk (DVD) or a hard disk drive (HDD).

The operation system 1007 gives an operation command regarding various functions of the present imaging device under an operation of a user. The power supply system 1008 appropriately supplies various power sources serving as operation power sources for the DSP circuit 1003, the frame memory 1004, the display device 705, the recording device 1006, and the operation system 1007 to these supply targets.

The imaging device having the above configuration can used as an imaging device for a video camera, a digital still camera, a cameral module for a mobile apparatus, such as a portable telephone device, or the like. In addition, in the imaging device, the above imaging device can be used as the imaging element 1002.

<Usage Example of Imaging Device>

Figure 23:
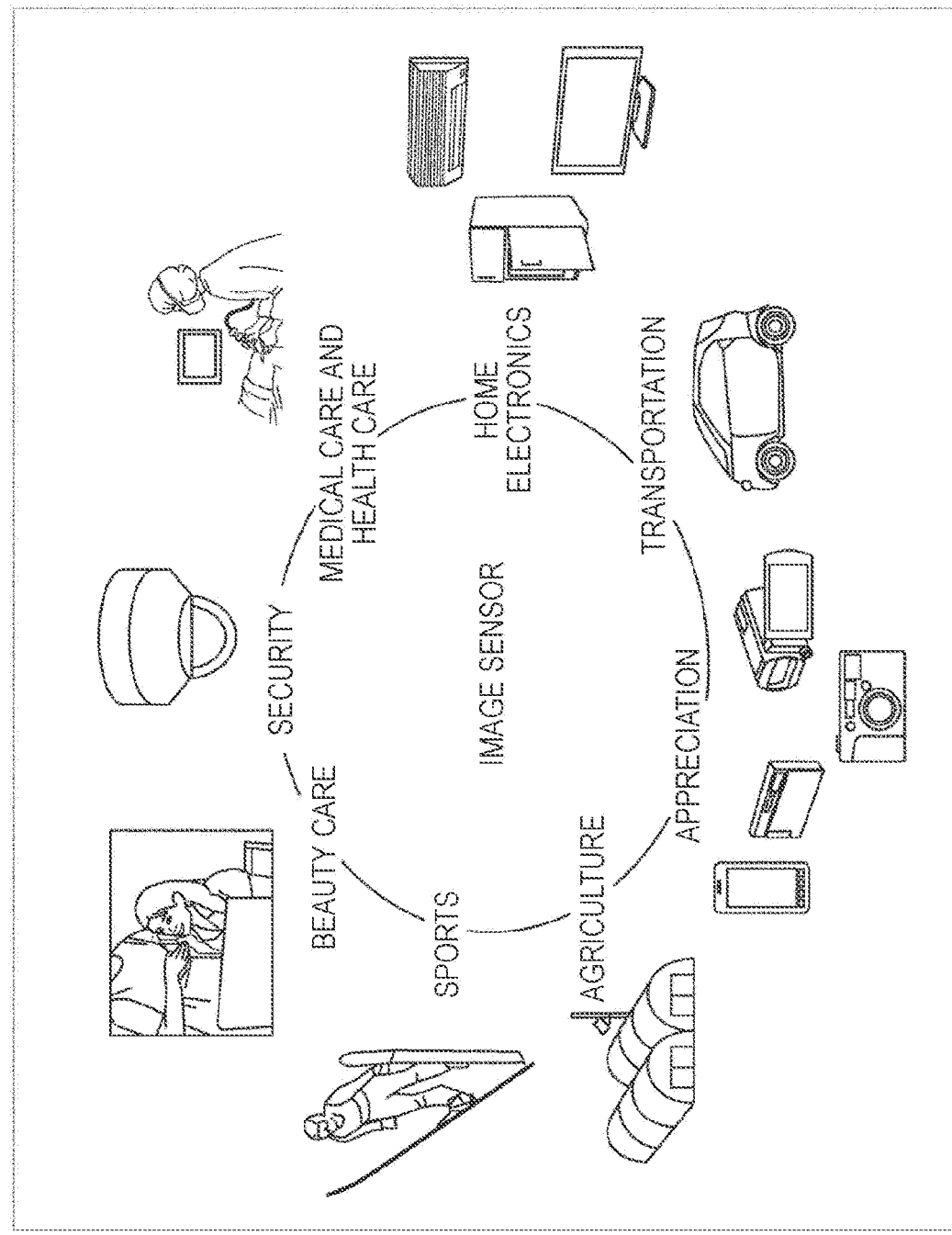
FIG. 23 is a diagram for explaining a usage example of an imaging device.

FIG. 23 is a diagram illustrating a usage example using the above imaging device.

As described below, the above imaging device can be used in various cases of sensing light such as visible light, infrared light, ultraviolet light, or an X-ray.

- a device for taking an image used for appreciation, such as a digital camera or a portable apparatus with a camera function,
- a device for transportation use, such as a vehicle-mounted sensor for imaging the front, the back, the surrounding, the inside, or the like of an automobile for safe driving such as automatic stop, for recognition of a driver's condition, and the like, a surveillance camera for monitoring a running vehicle and a road, or a measuring sensor for measuring a distance between vehicles or the like,
- a device for home electronics use, such as a television set, a refrigerator, or an air conditioner for imaging a gesture of a user and operating an apparatus according to the gesture,
- a device for medical care use and health care use, such as an endoscope or a device for receiving infrared light for angiography,
- a device for security use, such as a surveillance camera for crime prevention or a camera for personal authentication,
- a device for beauty care use, such as a skin measurement device for imaging a skin or a microscope for imaging a scalp,
- a device for sports use, such as an action camera or a wearable camera for sports, and
- a device for agricultural use, such as a camera for monitoring a condition of a field and a crop.

Note that the effects described here are merely examples, and the effects of the present technology are not limited thereto, and may include other effects.

Note that embodiments of the present technology are not limited to the above embodiments, and various modifications can be made to them without departing from the scope of the present technology.

Note that the present technology can have the following configurations.

(1)

An imaging device including:

an organic photoelectric conversion film;

an upper electrode provided in an upper portion of the organic photoelectric conversion film;

a lower electrode provided in a lower portion of the organic photoelectric conversion film; and a metal thin film provided between the organic photoelectric conversion film and the upper electrode or between the organic photoelectric conversion film and the lower electrode.

(2)

The imaging device described in (1), in which the metal thin film is provided between the organic photoelectric conversion film and the upper electrode, and the upper electrode is formed of an oxide semiconductor, a metal oxide, and the metal thin film.

(3)

The imaging device described in (2), in which the metal oxide is aluminum oxide (AlO), and the metal thin film is formed of aluminum (Al).

(4)

The imaging device described in any one of (1) to (3), in which the metal thin film is formed of any one of aluminum (Al), indium (In), silver (Ag), gold (Au), zinc (Zn), lithium (Li), tin (Sn), antimony (Sb), magnesium (Mg), cadmium (Cd), calcium (Ca), potassium (K), rubidium (Rb), cesium (Cs), strontium (Sr), barium (Ba), cerium (Ce), yttrium (Y), hafnium (Hf), nickel (Ni), gallium (Ga), and titanium (Ti).

(5)

The imaging device described in any one of (1) to (4), in which
each of the upper electrode and the lower electrode is formed of any one of ITO, tin oxide-based $SnO_2$, zinc oxide-based materials aluminum zinc oxide, gallium zinc oxide, and indium zinc oxide, IGZO, CuI, $InSbO_4$, ZnMgO, $CuInO_2$, $MgIn_2O_4$, CdO, and $ZnSnO_3$.

(6)

The imaging device described in any one of (1) to (5), in which
the organic photoelectric conversion film is formed of any one of a quinacridone derivative, a naphthalene derivative, an anthracene derivative, a phenanthrene derivative, a tetracene derivative, a pyrene derivative, a perylene derivative, and a fluoranthene derivative.

(7)

The imaging device described in any one of (1) to (6), in which the organic photoelectric conversion film is formed of any one of a polymer of phenylene vinylene, fluorene, carbazole, indole, pyrene, pyrrole, picoline, thiophene, acetylene, or diacetylene, and a derivative thereof, a metal complex dye, a cyanine dye, a merocyanine dye, a phenylxanthene dye, a triphenylmethane dye, a rhodacyanine dye, a xanthene dye, a macrocyclic azaannulene dye, an azulene dye, naphthoquinone, an anthraquinone dye, a condensed polycyclic aromatic compound such as anthracene or pyrene, a chain compound obtained by condensing an aromatic ring or heterocyclic compound, a heterocyclic ring compound containing two nitrogen atoms and having a squarylium group and a croconic methine group as a bonding chain, such as quinoline, benzothiazole, or benzoxazole, and a cyanine-like dye bonded by a squarylium group and a croconic methine group, and
the metal complex dye is any one of a dithiol metal complex dye, a metal phthalocyanine dye, a metal porphyrin dye, and a ruthenium complex dye.

(8)

The imaging device described in any one of (1) to (7), in which
the metal thin film has a thickness of 5 nm or less.

(9)

The imaging device described in any one of (1) to (8), in which the metal thin film is formed into a spherical shape or a predetermined shape, and is scattered at equal intervals or at random.

(10)

The imaging device described in any one of (1) to (9), further including a hole blocking layer between the metal thin film and the organic photoelectric conversion film.

(11)

The imaging device described in (1), including an enthalpy control layer along with the metal thin film or in place of the metal thin film.

(12)

The imaging device described in (11), in which the enthalpy control layer is provided between the organic photoelectric conversion film and the lower electrode.

(13)

The imaging device described in (11), in which the enthalpy control layer is formed of any one of $Ag_2O$, CoO, $Co_3O_4$, CdO, $Cs_2O$, CuO, $Cu_2O$, GeO(c), $GeO_2$(c1), $GeO_2$(c2), NiO(c), PbO(c), $PbO_2$(c2), $PbO_2$(c), PdO(c), $Rb_2O$(c), $Rb_2O_2$(c), $SeO_2$(c), $SeO_3$(c), $TeO_2$ (C), $Tl_2O$(c), and $Tl_2O_3$(c).

(14)

A manufacturing device for
forming an organic photoelectric conversion film,
forming an upper electrode in an upper portion of the organic photoelectric conversion film,
forming a lower electrode in a lower portion of the organic photoelectric conversion film, and
forming a metal thin film between the organic photoelectric conversion film and the upper electrode or between the organic photoelectric conversion film and the lower electrode.

(15)

The manufacturing device described in (14), in which the metal thin film is formed by vapor deposition.

(16)

The manufacturing device described in (14) or (15), in which
the metal thin film is formed between the organic photoelectric conversion film and the upper electrode,
the upper electrode is formed by stacking an oxide semiconductor, a metal oxide, and the metal thin film, and
the metal oxide is formed by oxidization at the time of film formation of the oxide semiconductor.

(17)

The manufacturing device described in any one of (14) to (16), in which the metal thin film is formed into a spherical shape or a predetermined shape so as to be scattered at equal intervals or at random.

(18)

The manufacturing device described in any one of (14) to (16), in which
a hole blocking layer is further formed between the metal thin film and the organic photoelectric conversion film.

(19)

The manufacturing device described in any one of (14) to (16), in which
an enthalpy control layer is formed along with the metal thin film or in place of the metal thin film.

(20)

A manufacturing device for
forming an organic photoelectric conversion film,
a step of forming an upper electrode in an upper portion of the organic photoelectric conversion film;
a step of forming a lower electrode in a lower portion of the organic photoelectric conversion film; and
a step of forming a metal thin film between the organic photoelectric conversion film and the upper electrode or between the organic photoelectric conversion film and the lower electrode.

REFERENCE SIGNS LIST 31 upper electrode
32 organic photoelectric conversion film
33 lower electrode
34 insulating film
35 substrate
36 first photodiode PD
37 second photodiode PD
102, 112, 122 metal thin film
302 metal electrode
402 hole blocking layer
502 enthalpy control layer

What is claimed is:

1. An imaging device, comprising:
   an organic photoelectric conversion film;
   an upper electrode in an upper portion of the organic photoelectric conversion film;
   a lower electrode in a lower portion of the organic photoelectric conversion film; and
   an enthalpy control layer between the organic photoelectric conversion film and the lower electrode.

2. The imaging device according to claim 1, wherein the enthalpy control layer includes an oxide film containing one of cadmium (Cd), copper (Cu), lead (Pb), or palladium (Pd).

3. The imaging device according to claim 1, wherein the enthalpy control layer includes one of a Silver Oxide ($Ag_2O$), Cobalt(II) Oxide (CoO), Cobalt (II, III) Oxide ($Co_3O_4$), Cesium oxide ($Cs_2O$), Copper Oxide (CuO), Cuprous Oxide ($Cu_2O$), Germanium oxide (GeO), Germanium dioxide ($GeO_2$), Nickel Oxide (NiO), or Lead Oxide (PbO).

4. The imaging device according to claim 1, wherein the enthalpy control layer has a thickness of one of equal to 5 nm or less than 5 nm.

5. The imaging device according to claim 1, further comprising a metal thin film between the organic photoelectric conversion film and the upper electrode.

6. The imaging device according to claim 5, wherein
   the upper electrode comprises a hole blocking layer, and
   the hole blocking layer is between the metal thin film and the organic photoelectric conversion film.

7. The imaging device according to claim 5, wherein the metal thin film includes aluminum (Al).

8. The imaging device according to claim 5, wherein the metal thin film includes one of aluminum (Al), indium (In), silver (Ag), gold (Au), zinc (Zn), lithium (Li), tin (Sn), antimony (Sb), magnesium (Mg), cadmium (Cd), calcium (Ca), potassium (K), rubidium (Rb), cesium (Cs), strontium (Sr), barium (Ba), cerium (Ce), yttrium (Y), hafnium (Hf), nickel (Ni), gallium (Ga), or titanium (Ti).

9. The imaging device according to claim 1, wherein
   the lower electrode comprises an metal oxide layer, and
   the metal oxide layer is disposed between the organic photoelectric conversion film and the lower electrode.

10. The imaging device according to claim 1, wherein each of the upper electrode and the lower electrode includes one of ITO, tin oxide-based $SnO_2$, aluminum zinc oxide, gallium zinc oxide, indium zinc oxide, IGZO, CuI, $InSbO_4$, ZnMgO, $CuInO_2$, $MgIn_2O_4$, CdO, or $ZnSnO_3$.

11. The imaging device according to claim 1, wherein the organic photoelectric conversion film includes one of a quinacridone derivative, a naphthalene derivative, an anthracene derivative, a phenanthrene derivative, a tetracene derivative, a pyrene derivative, a perylene derivative, or a fluoranthene derivative.

12. The imaging device according to claim 1, wherein the organic photoelectric conversion film includes one of a polymer, a metal complex dye, a cyanine dye, a merocyanine dye, a phenylxanthene dye, a triphenylmethane dye, a rhodacyanine dye, a xanthene dye, a macrocyclic azaannulene dye, an azulene dye, naphthoquinone, an anthraquinone dye, a condensed polycyclic aromatic compound, a chain compound, a heterocyclic ring compound, or a first dye.

13. The imaging device according to claim 12, wherein
   the polymer is one of phenylene vinylene, fluorene, carbazole, indole, pyrene, pyrrole, picoline, thiophene, acetylene, or diacetylene,
   the metal complex dye is one of a dithiol metal complex dye, a metal phthalocyanine dye, a metal porphyrin dye, or a ruthenium complex dye,
   the condensed polycyclic aromatic compound is one of anthracene or pyrene,
   the chain compound is one of a condensed aromatic ring or a condensed heterocyclic compound,
   the heterocyclic ring compound is one of quinoline, benzothiazole, or benzoxazole, and
   the first dye is bonded by one of a squarylium group or a croconic methine group.

14. The imaging device according to claim 1, wherein
   the upper electrode comprises an oxide semiconductor, a metal oxide, and a metal thin film,
   the oxide semiconductor, the metal oxide, and the metal thin film are stacked, and
   the metal oxide is an oxidized portion of the metal thin film.

15. The imaging device according to claim 1, wherein
   a standard enthalpy of formation of a material of the enthalpy control layer is higher than a standard enthalpy of formation of a material of the lower electrode, and
   the enthalpy control layer is reduced selectively.

16. The imaging device according to claim 15, wherein the enthalpy control layer is configured to prevent hydrogen from entering the lower electrode.

17. The imaging device according to claim 1, wherein the upper electrode comprises an oxide semiconductor (ITO) and an aluminum oxide (AlO) thin film.

* * * * *